(12) United States Patent
Hamel et al.

(10) Patent No.: US 7,361,998 B2
(45) Date of Patent: Apr. 22, 2008

(54) ENERGY HARVESTING FOR WIRELESS SENSOR OPERATION AND DATA TRANSMISSION

(75) Inventors: Michael John Hamel, Williston, VT (US); Steven W. Arms, Williston, VT (US); Christopher P Townsend, Shelburne, VT (US); David L. Churchill, Burlington, VT (US)

(73) Assignee: MicroStrain, Inc., Williston, VT (US)

( * ) Notice: Subject to any disclaimer, the term of this patent is extended or adjusted under 35 U.S.C. 154(b) by 370 days.

(21) Appl. No.: 11/023,198

(22) Filed: Dec. 24, 2004

(65) Prior Publication Data

US 2005/0116545 A1    Jun. 2, 2005

Related U.S. Application Data

(62) Division of application No. 10/379,223, filed on Mar. 5, 2003, now Pat. No. 7,081,693.

(60) Provisional application No. 60/443,120, filed on Jan. 28, 2003, provisional application No. 60/362,432, filed on Mar. 7, 2002.

(51) Int. Cl.
    *B60C 23/00* (2006.01)
(52) U.S. Cl. .................................................. 290/1 R
(58) Field of Classification Search ...................... 290/2
    See application file for complete search history.

(56) References Cited

U.S. PATENT DOCUMENTS

| | | | |
|---|---|---|---|
| 3,786,413 A * | 1/1974 | Ross et al. | 340/443 |
| 4,237,454 A * | 12/1980 | Meyer | 340/682 |
| 4,631,921 A | 12/1986 | Linderfelt | |
| 5,459,360 A | 10/1995 | Varo | |
| 5,672,946 A * | 9/1997 | Kawashima et al. | 318/444 |
| 5,710,539 A * | 1/1998 | Iida | 340/444 |
| 6,191,687 B1 | 2/2001 | Dlugos | |
| 6,297,742 B1 * | 10/2001 | Canada et al. | 340/635 |
| 6,304,176 B1 | 10/2001 | Discenzo | |
| 6,366,211 B1 * | 4/2002 | Parker | 340/693.2 |
| 6,438,193 B1 * | 8/2002 | Ko et al. | 377/24.1 |

(Continued)

FOREIGN PATENT DOCUMENTS

DE      19744611 A1 *   4/1999

(Continued)

OTHER PUBLICATIONS

FAX from James Marc Leas of Aug. 6, 2007.*

(Continued)

*Primary Examiner*—Joseph Waks
(74) *Attorney, Agent, or Firm*—James Marc Leas

(57) ABSTRACT

A device for powering a load from an ambient source of energy is provided. The device includes an energy harvesting device for harvesting energy from the ambient source of energy wherein the rate energy is harvested from the ambient source of energy is below that required for directly powering the load. A storage device is connected to the energy harvesting device. The storage device receives electrical energy from the energy harvesting device and is for storing the electrical energy. A controller is connected to the storage device for monitoring the amount of electrical energy stored in the storage device and for switchably connecting the storage device to the load when the stored energy exceeds a first threshold. The system can be used for powering a sensor and for transmitting sensor data, such as tire pressure.

48 Claims, 14 Drawing Sheets

U.S. PATENT DOCUMENTS

| | | | |
|---|---|---|---|
| 6,469,499 | B2 | 10/2002 | Delaporte |
| 6,484,582 | B2* | 11/2002 | Ehrfeld et al. ................ 73/593 |
| 6,574,679 | B1* | 6/2003 | Chliwnyj et al. ............. 710/10 |
| 6,604,434 | B1 | 8/2003 | Hamilton |
| 6,612,188 | B2 | 9/2003 | Hamilton |
| 6,763,288 | B2* | 7/2004 | Caretta et al. ................. 701/1 |
| 6,768,418 | B2* | 7/2004 | Tominaga et al. .......... 340/444 |
| 6,888,450 | B2* | 5/2005 | Sasaki et al. ............... 340/445 |
| 6,959,593 | B2* | 11/2005 | Mancosu et al. ............. 73/146 |
| 6,971,799 | B2* | 12/2005 | Sato et al. .................. 384/448 |
| 2004/0040391 | A1* | 3/2004 | May ...................... 73/862.331 |
| 2004/0095231 | A1* | 5/2004 | Ichinose .................... 340/442 |
| 2004/0100100 | A1* | 5/2004 | Wilson ....................... 290/1 R |
| 2004/0155764 | A1* | 8/2004 | Ichinose .................... 340/447 |
| 2004/0257213 | A1* | 12/2004 | Tsujita ........................ 340/445 |
| 2005/0026643 | A1* | 2/2005 | White et al. ............ 455/550.1 |
| 2006/0006991 | A1* | 1/2006 | Tyndall et al. ............. 340/442 |
| 2006/0249320 | A1* | 11/2006 | Carter et al. ............... 180/65.5 |

FOREIGN PATENT DOCUMENTS

| | | | |
|---|---|---|---|
| DE | 19807004 | A1 * | 9/1999 |
| DE | 10253367 | A1 * | 6/2004 |
| EP | 286095 | A1 * | 10/1988 |
| GB | 2307044 | A * | 5/1997 |
| WO | WO 8701527 | A1 * | 3/1987 |

OTHER PUBLICATIONS

Scott Meninger, et al, "Vibration-to Electric Energy Conversion," 1999, p. 48-53, Advanced Sensors Consortium.

C. Shearwood, et al, "Development of an electromagnetic microgenerator," Electronic Letters, Oct. 23, 1997, vol. 33, #22, p. 883-884.

C.B. Williams, et al, "Feasibility study of vibration-electric generator for bridge vibration sensors," IMAC-XVI Proceedings, 1997, p. 1111-1117.

Shenck, et al, "Energy Scavanging with Shoe-Mounted Piezoelectrics," IEEE computer Society, May 2001, 22 pages, http://computer.org/micro/homepage/may_june/shenck/index.htm.

Brian Esser, et al, "Wireless Inductive Robotic Inspection of Structures," Proceedings of IASTED International Conference Robootics and Applications Aug. 14-16, 2000, p. 1-6.

* cited by examiner

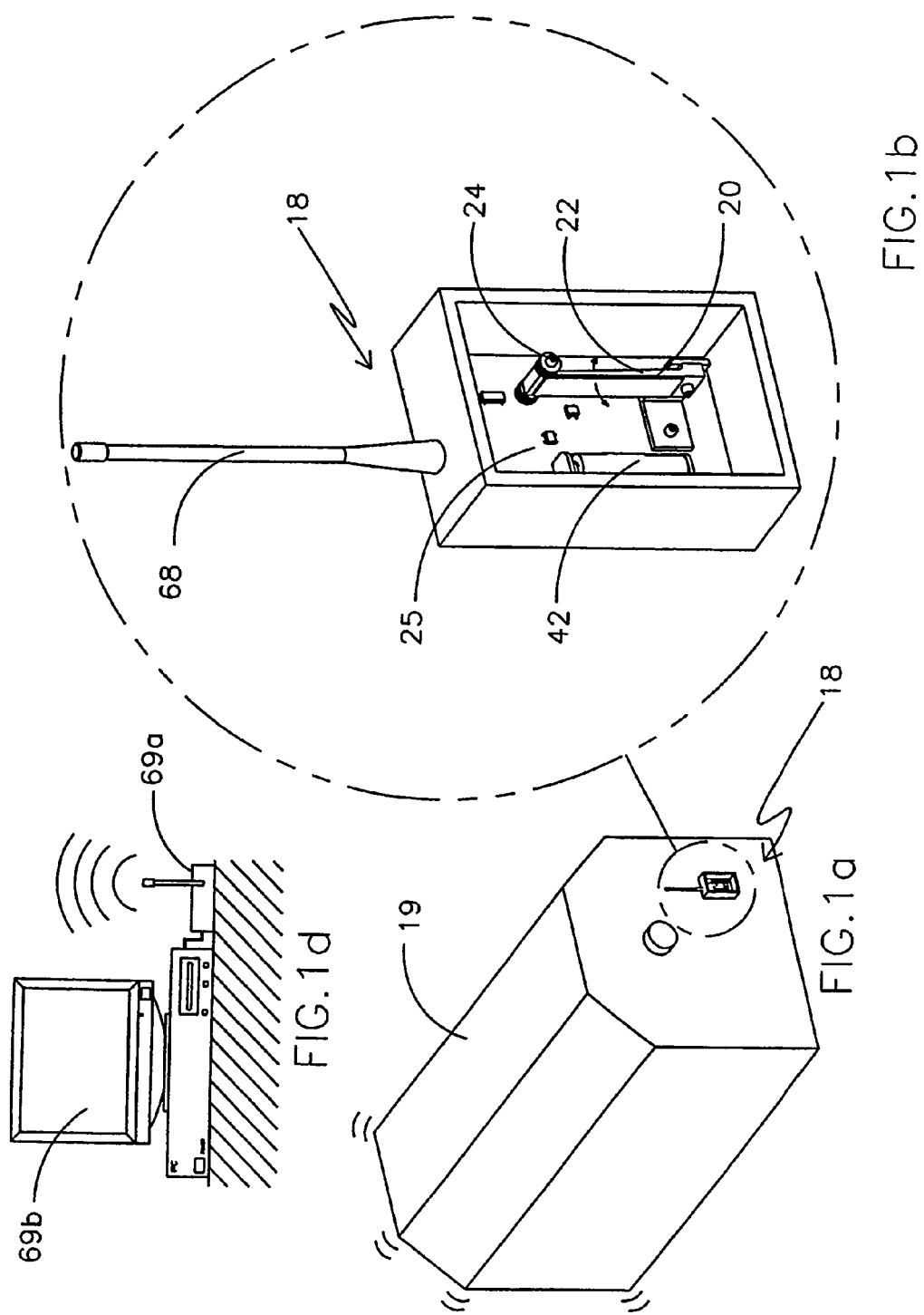

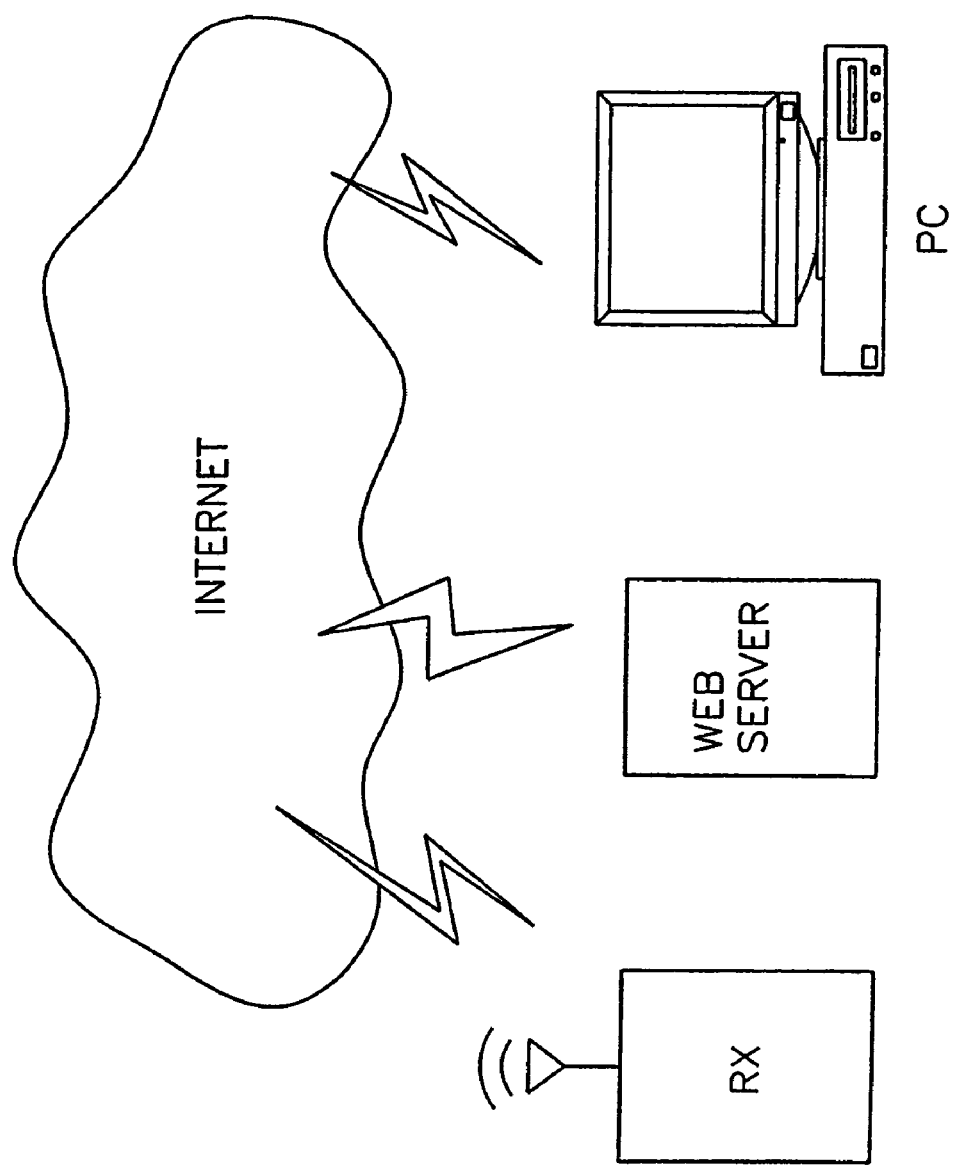
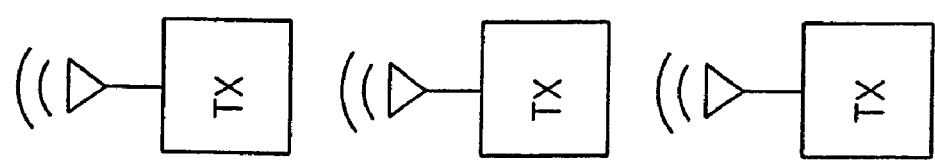
FIG. 12

ENERGY HARVESTING FOR WIRELESS SENSOR OPERATION AND DATA TRANSMISSION

RELATED APPLICATIONS

This patent application is a divisional of U.S. patent application Ser. No. 10/379,223, filed Mar. 5, 2003, now U.S. Pat. No. 7,081,693, incorporated herein by reference, and claims benefit of provisional patent application 60/362,432, filed Mar. 7, 2002, incorporated herein by reference and provisional patent application 60/443,120, filed Jan. 28, 2003, incorporated herein by reference. This patent application is related to the following U.S. patent applications:

U.S. Ser. No. 09/731,066, filed Dec. 6, 2000, incorporated herein by reference;

U.S. Ser. No. 09/757,909, filed Jan. 10, 2001, incorporated herein by reference;

U.S. Ser. No. 09/801,230, filed Mar. 7, 2001, incorporated herein by reference;

U.S. Ser. No. 09/768,858, filed Jan. 24, 2001, incorporated herein by reference;

U.S. Ser. No. 09/114,106, filed Jul. 11, 1998, incorporated herein by reference;

U.S. Ser. No. 09/457,493, filed Dec. 8, 1999, incorporated herein by reference; and non-provisional patent application having U.S. Ser. No. 10/379,224, filed the same day as this application, incorporated herein by reference.

FIELD OF THE INVENTION

This invention generally relates to collecting and transmitting data. More particularly, it relates to a device for sensing, storing and transmitting data. Even more particularly, it relates to a device that can that can be attached to a structure or live subject and that can harvest energy from its environment to power sensing, storing and transmitting data about the structure or live subject.

BACKGROUND OF THE INVENTION

Several available devices convert mechanical energy in the local environment into electrical energy, including the Seiko "Kinetic" watch and mechanical wind-up radios. An article, "Energy Scavenging with Shoe-Mounted Piezoelectrics," by N. S. Shenck and J. A Paradiso http://computer-.org/micro/homepage/may_june/shenck/index.htm, reports on systems that capture energy from the user's environment to provide electricity to wearable microelectronic devices without batteries. The unobtrusive devices scavenge electricity from the forces exerted on a shoe during walking. The devices include a flexible piezoelectric foil stave to harness sole-bending energy and a reinforced piezoelectric dimorph to capture heel-strike energy. They also report on prototype development of radio frequency identification (RFID) tags which are self powered by a pair of sneakers.6 A recent report by Meniger et al., entitled "Vibration-to-Energy Conversion", discloses a microelectromechanical system (MEMs) device for the conversion of ambient mechanical vibration into electrical energy through the use of a variable capacitor http://www.kric.ac.kr:8080/pubs/articles/proceedings/dac/313817/p48-meninger/p48-men inger.pdf. However, these MEMs systems only demonstrated 8 microwatts of power. Transmission of RF data over distances of 20 feet or more requires milliwatt power levels.

Low power sensors have been developed, as described on commonly assigned U.S. patent application Ser. No. 09/731,066, to Arms, that includes a sensing unit for attaching to a structure or live subject for sensing a parameter of the structure or live subject. The sensing unit includes a sensor, a data storage device, and a transmitting device. The data storage device is for storing data from the sensor. Power is provided by a power supply such as a rechargeable battery or fuel cell. The rechargeable battery can be recharged by inductive coupling from an external control unit.

Over the past years, sensors, signal conditioners, processors, and digital wireless radio frequency (RF) links have become smaller, consumed less power, and included higher levels of integration. The U.S. Ser. No. 09/731,066 application, for example, provides sensing, acquisition, storage, and reporting functions. Wireless networks coupled with intelligent sensors and distributed computing have enabled a new paradigm of machine monitoring.

A paper, "Wireless Inductive Robotic Inspection of Structures," by Esser, et al, proceedings of the IASTED International Conference, Robotics and Applications 2000, Aug. 14-16, 2000, Honolulu, Hi., describes an autonomous robotic structural inspection system capable of remote powering and data collection from a network of embedded sensing nodes and providing remote data access via the internet. The system uses microminiature, multichannel, wireless programmable addressable sensing modules to sample data from a variety of sensors. The nodes are inductively powered, eliminating the need for batteries or interconnecting lead wires.

Wireless sensors have the advantage of eliminating the cost of installing wiring. They also improve reliability by eliminating connector problems. However, wireless sensors still require system power in order to operate. If power outages occur, critical data collected by the sensors may be lost. In some cases, sensors may be hardwired to a vehicle's power system. In other cases however, the need to hard wire to a power system defeats the advantages of wireless sensors, and this may be unacceptable for many applications. Most prior wireless structural monitoring systems have therefore relied on continuous power supplied by batteries. For example, in 1972, Weiss developed a battery powered inductive strain measurement system, which measured and counted strain levels for aircraft fatigue. Traditional batteries, however, become depleted and must be periodically replaced or recharged, adding an additional maintenance task that must be performed. This is particularly a problem for monitors used for a condition based maintenance program since it adds additional maintenance for the condition based monitoring system itself.

None of the systems for sensing changes in the environment have collected available mechanical energy to provide the electricity for running the sensors, storing data from the sensor, or communicating the data externally. Thus, a better system for powering sensors and storage devices, and for transmitting data gathered by sensors is needed, and this solution is provided by the following invention.

SUMMARY OF THE INVENTION

It is therefore an object of the present invention to provide a scheme for powering a wireless sensor system with a source of energy that avoids the need to provide, replace or recharge batteries;

It is a further object of the present invention to provide a scheme for powering a load with energy harvested from an ambient source of energy in the local area, wherein the rate at which energy is harvested from the ambient source of energy is below that required for directly powering the load.

It is a further object of the present invention to provide a scheme for powering a sensor system with ambient mechanical energy collected from the environment of the sensor system or with energy obtained from ambient magnetic field coupled energy;

It is a further object of the present invention to provide a network of sensor systems in which sensors on the network are powered with ambient energy collected from the environment;

It is a further object of the present invention to provide a device for monitoring the health of a machine or another system in which the monitoring device is powered with ambient energy harvested from the environment.

It is a further object of the present invention to provide a sensing system that includes a sensor that is read with electrical energy obtained from the harvested mechanical energy;

It is a further object of the present invention to provide a wireless transmitter connected to receive and transmit information obtained by the sensor, in which the wireless transmitter is powered with electrical energy obtained from the harvested mechanical energy;

It is a feature of the present invention that a sensing system includes a component for harvesting ambient mechanical or magnetic energy and converts this energy into electrical energy;

It is a feature of the present invention to provide a data collection device that is powered by the electrical energy obtained from the harvested mechanical energy;

It is an advantage of the present invention that the data collection device can provide information about the environment using energy harvested from the environment; and It is a further advantage of the present invention that the data collection device does not itself require maintenance for replacing or recharging batteries.

These and other objects, features, and advantages of the invention are accomplished by a device for powering a load from an ambient source of energy. The device comprises an energy harvesting device for harvesting energy from the ambient source of energy wherein the rate energy is harvested from the ambient source of energy is below that required for directly powering the load. A storage device is connected to the energy harvesting device. The storage device receives electrical energy from the energy harvesting device and is for storing the electrical energy. A controller is connected to the storage device is for monitoring the amount of electrical energy stored in the storage device and for switchably connecting the storage device to the load when the stored energy exceeds a first threshold.

Another aspect of the invention is an energy harvesting system comprising a piezoelectric transducer and a rectifier. The system also includes a reactive device having a high impedance approximately matching impedance of the piezoelectric transducer at its operating frequency for efficiently transferring energy from the piezoelectric transducer to the reactive device. The system also includes a low impedance high capacity storage device. The system also includes a circuit for monitoring voltage across the reactive device, and for transferring the charge from the reactive device to the low impedance high capacity storage device when the voltage across the reactive device reaches a specified voltage value.

Another aspect of the invention is a device for sensing temperature or pressure in a tire. The device includes a tire and a PZT mounted on the tire. The device also includes a circuit for harvesting energy from the PZT, wherein the circuit comprises an element having an impedance approximately matching impedance of the PZT. The device also includes a sensing module connected to the circuit, the sensing module including a sensor and a circuit for wirelessly transmitting sensor information.

BRIEF DESCRIPTION OF THE DRAWINGS

The foregoing and other objects, features, and advantages of the invention will be apparent from the following detailed description of the invention, as illustrated in the accompanying drawings, in which:

FIG. 1a is a perspective view of an energy harvesting addressable wireless sensing node of the present invention mounted on a machine or structure;

FIG. 1b is a perspective view of components within the energy harvesting addressable wireless sensing node;

FIG. 1d is a schematic diagram of a base station for receiving said wirelessly transmitted information;

FIG. 11a is a block diagram of an improved embodiment of an energy harvesting addressable wireless sensing node of the present invention having an additional stage of charge storage, monitoring, switching, and impedance conversion between the rectifier and the controller of FIG. 3a;

FIG. 11b is a schematic diagram showing more detail than the block diagram of FIG. 11a; and FIG. 12 is a schematic diagram showing a wireless web enabled sensor network (WWSN) system that requires very little power.

DETAILED DESCRIPTION OF THE INVENTION

Figure 1C:
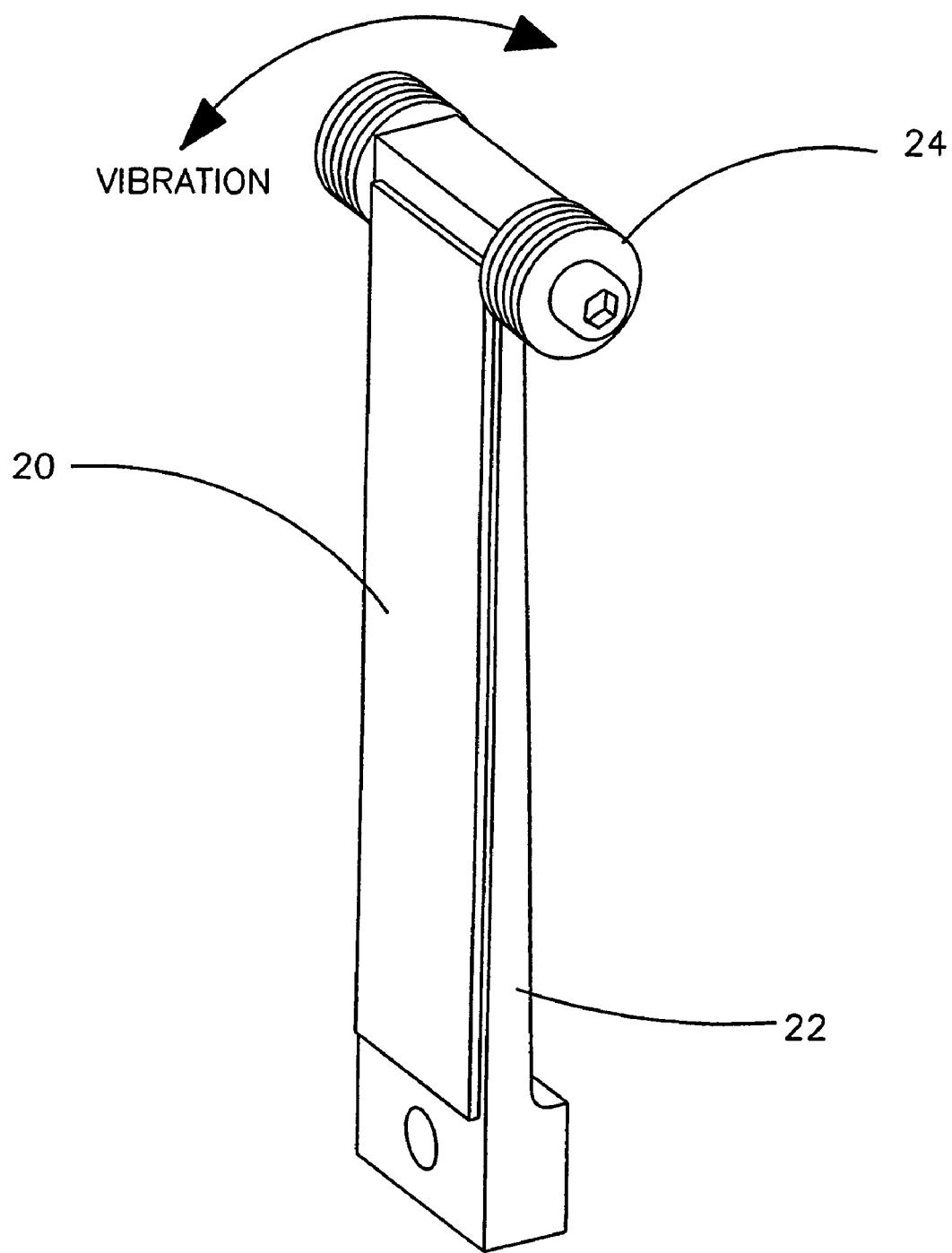
FIG. 1c is a perspective view of the energy harvesting cantilever shown in FIG. 1b with variable mass for tuning to a vibration frequency of the machine or structure.

The present inventors recognized that substantial efficiency in collecting, storing, and transmitting data from wireless sensors could be provided by harvesting energy from the environment.

This invention is aimed at developing a new class of sensing systems that can wirelessly report data without the need for maintaining or replacing batteries. Instead, the sensing systems rely on harvesting vibration, strain energy, or magnetic coupled energy from the local environment for conversion to electrical power for storage and use to collect, store, or transmit data by the sensing system. Thus, machines, structures, and live subjects can be monitored without the need for replacing or recharging batteries or for a battery maintenance schedule. Truly smart structures and machines will thus be able to autonomously report their condition throughout their operating life without the mechanism used for reporting the data itself requiring maintenance. The system can be used to run and communicate with actuators as well as sensors.

One important use of the present invention is to improve traditional condition based maintenance. Condition based maintenance provides a more accurate and cost effective maintenance program for equipment or structures. The present invention reduces unnecessary preventive maintenance for the devices used to monitor. In addition to providing for wireless communication without batteries, the present invention provides the components necessary to realize the potential benefits of condition based monitoring, including information acquisition, analysis, storage, and reporting technologies that substantially lower power requirements, making energy harvesting for condition based maintenance a realistic source of energy.

An illustration of condition based maintenance and another important use for the present invention is aboard ships where batteryless sensing systems may be used for wirelessly monitoring oil debris or oil condition, tank & hull corrosion, combustion pressure, water-lubricated-bearing wear, and machine condition. The invention can also be used for integrated, hierarchical machinery diagnostics & prognostics; machinery diagnostics & prognostics; open systems architecture condition based maintenance; human—computer interface condition based maintenance; and diagnostic of insulation, such as wire and windings. The invention can also be used on land vehicles or aircraft for purposes such as to monitor and report tire temperature and pressure. In each case mechanical energy, such as the energy of vibration of the vehicle, can be used to power the sensor and its storage or communications apparatus.

Batteries, and the additional maintenance burden for replacing or recharging batteries, are avoided in the present invention by providing wireless sensing network systems which can harvest energy from the local environment to provide the power needed for their own operation.

Numerous sources of ambient energy can be exploited for energy harvesting, including solar, wind, thermoelectric, water/wave/tide, rotation, strain, and vibration. For shipboard monitoring applications below deck and for monitoring tire pressure and temperature, mechanical energy harvesting devices, such as those that harvest strain or vibrational energy are preferred. In Navy applications, strain energy would be available on engine mounts, ship hull sections, and structural support elements. Vibrational energy would be available on diesel turbine engine components, propeller shaft drive elements, and other machinery and equipment. This energy could be harvested using electromagnetic devices (coil with permanent magnet), Weigand effect devices, and piezoelectric transducer (PZT) materials. Of these, the PZT materials hold the most promise.

Recent developments in single crystal PZT have led to significant improvements in the mechanical-to-electrical conversion coefficients (coupling coefficients), from 60% efficiency to 90% efficiency. Single crystals also exhibit higher operating strain capabilities than conventional PZT materials (0.2% vs. 1.4%). These materials are available through TRS Ceramics (State College, Pa. http://trsceramics.com/Single_Crystal.pdf).

Furthermore, PZT fibers have recently been made commercially available at low cost for active damping of sporting equipment, such as baseball bats, tennis rackets, and skis (Advanced Cerametrics, Lambertville, N.J., www.advancedcerametrics.com/piezo_fiber.html). These fibers may be directly bonded to a straining element or structure to generate electrical energy that can be harvested. Major advantages of these fiber piezoelectric materials is that they can tolerate the loss of many individual fibers in a bundle and still function well. Since they are in mass production, they may be obtained readily and at relatively low cost. Because of these advantages the present invention describes the use of these PZT materials for energy harvesting wireless sensor networks. However, other devices and other sources of ambient energy can also be used.

The present inventors have used single crystal and PZT fibers to create working energy harvesting prototypes that provide sufficient energy to power StrainLink wireless sensor transmitters available from MicroStrain, Inc. (StrainLink, http://www.microstrain.com/slink.html).

Energy harvesting addressable wireless sensing node 18 can be attached to machine or structure 19 that is subject to vibration, as shown in FIG. 1*a*. In one embodiment, PZT 20 is mounted to cantilever 22 which can be tuned with variable mass 24, as shown in FIGS. 1*b* and 1*c*, to provide a device resonance frequency close to the vibration frequency of machine or structure 19, thereby optimizing energy harvesting. PZT 20 can be either a crystal or a fiber. Cantilever 22 is mounted on PC board 25 in enclosure 26.

Figure 2:
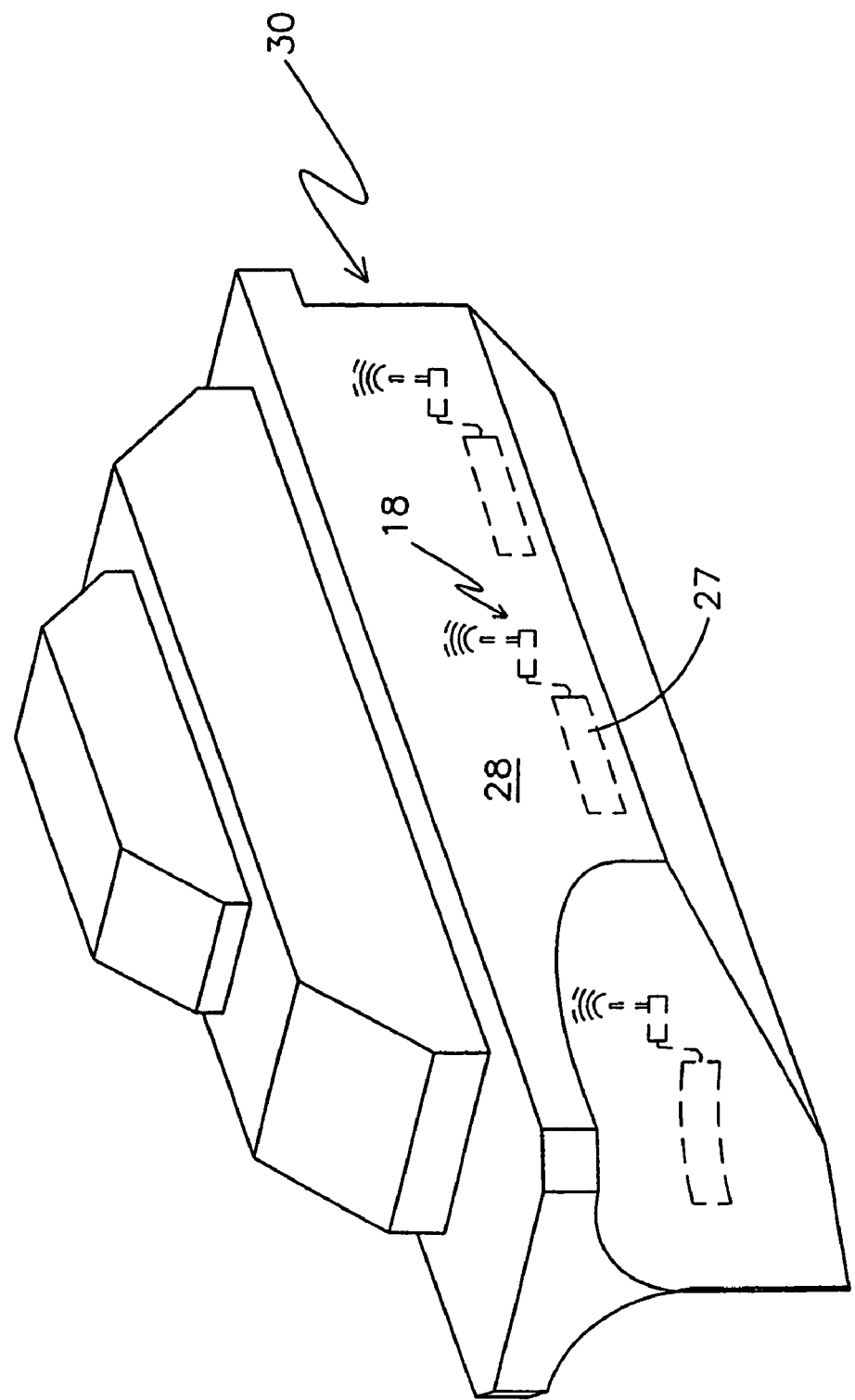
FIG. 2 is an alternative embodiment in which a large sheet of PZT fiber is embedded in material, such as a hull of ship so vibration or strain energy transmitted through the hull can be harvested.

Alternatively, a large sheet of PZT fiber 27 can be embedded in material of hull 28 of ship 30 so vibration or strain energy transmitted through hull 28 can be harvested, as shown in FIG. 2. Large sheets of PZT fiber 27 are preferred because tuning is not readily available to harvest the strain energy. A structure, such as hull 28 or the deck of a bridge bends only a limited amount, and the bending cannot be tuned as can flexural element by adjusting mass so as to take advantage of resonance frequency to harvest more of the energy.

Figure 3A:
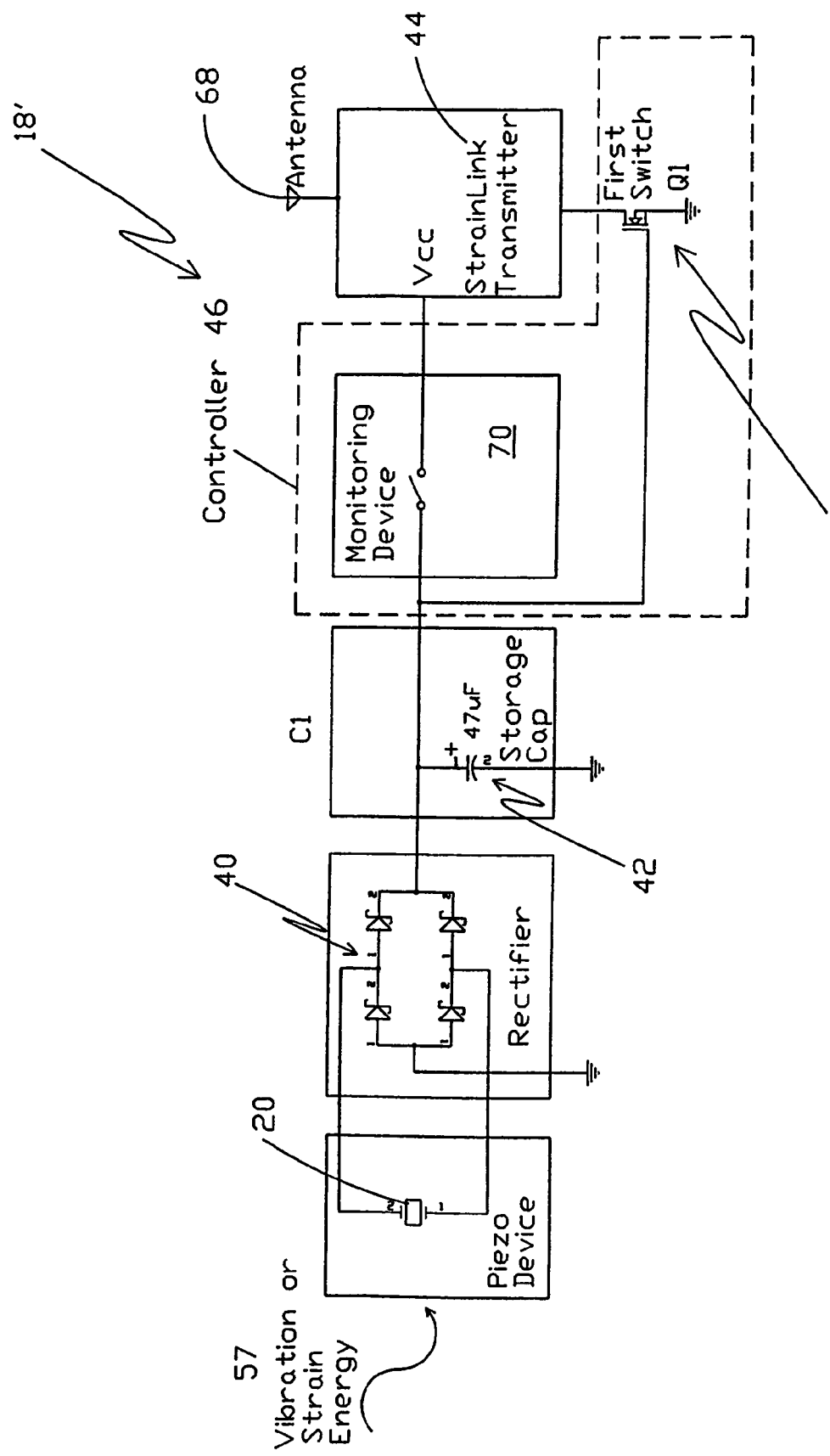
FIG. 3a, 3b are block diagrams of one embodiment of an energy harvesting addressable wireless sensing node of the present invention in which energy is harvested by a PZT.

In the mechanical vibration embodiment, the source of mechanical energy, such as machine or structure 19, is converted to electrical energy in energy harvesting addressable wireless sensing node 18', which includes a miniature electric generator, such as PZT 20, as shown in FIG. 3*a*. A miniature electric generator can also be provided with a coil and magnet in relative rotational motion, as for example, would be available in the vicinity of spinning machinery or wheels.

Electrical power generated in PZT 20 is rectified in rectifier 40, stored in electrical storage device 42, and once sufficient energy has been stored, is provided to a load, such as wireless sensing module 44, by means of controller 46.

Figure 3B:
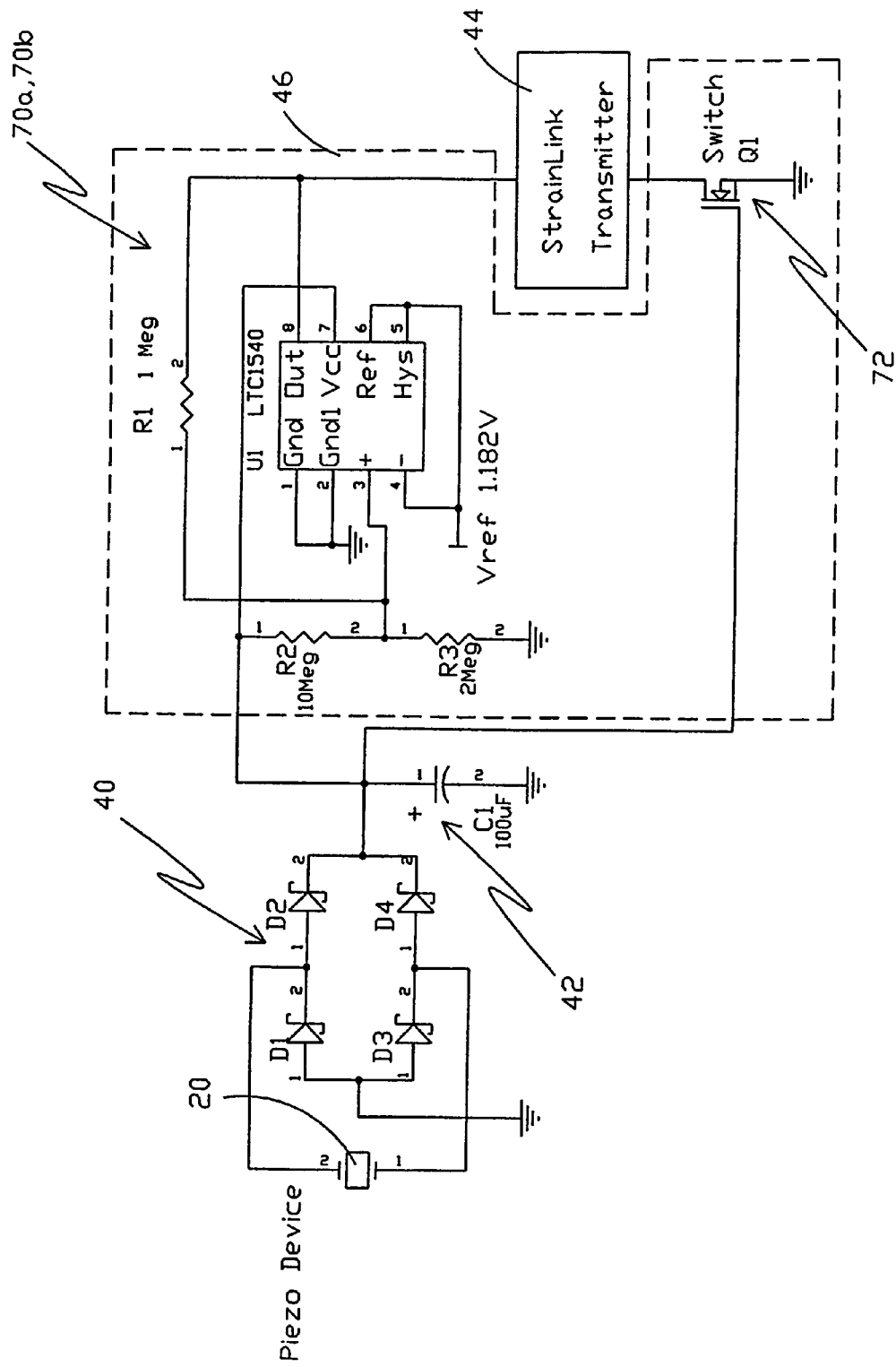

In one experiment, a single crystal PZT 20 was connected to the circuit shown in FIGS. 3*a*, 3*b*, while vibration was applied to PZT 20. With a DC voltmeter across storage capacitor 42, upwards of 20 volts was measured across the capacitor with approximately 0.08 inch deflection of the PZT 20 at a 50 Hz rate.

PZT 20 is inherently a high impedance device which provides a nearly constant current, so the storage capacitor charges linearly with time. Thus, the time for storage capacitor 42 to charge is found from T=CV/I where C=capacitance value, V=voltage charged to, and I=the charging current.

The Microstrain StrainLink transmitter is also a constant current load, so calculating the discharge uses the same formula. A 47 uF cap charged to 16 volts will supply 2.8 mA for 268 mS discharging to zero volts. A low power Strain-Link transmitter can be connected as load 44 in the circuit of FIG. 3a, 3b and can run for 224 mS before reaching the reset voltage of 2.63 volts. This is enough time to transmit data from several sensors. Obviously a bigger storage capacitance would supply a longer operating time as would any reduction in load current presented by the transmitter. However, a longer time would be needed to charge a larger capacitor. Furthermore, the practicality of such a system is dependant on the continued availability of vibration input energy. Thus, the present device is ideally suited to applications where ambient vibration is continuous for long periods to provide for the self-discharge rate of storage capacitor 42, to provide power consumed by the circuit used to monitor charge and switch on the load, as well as to power the load.

Figure 4:
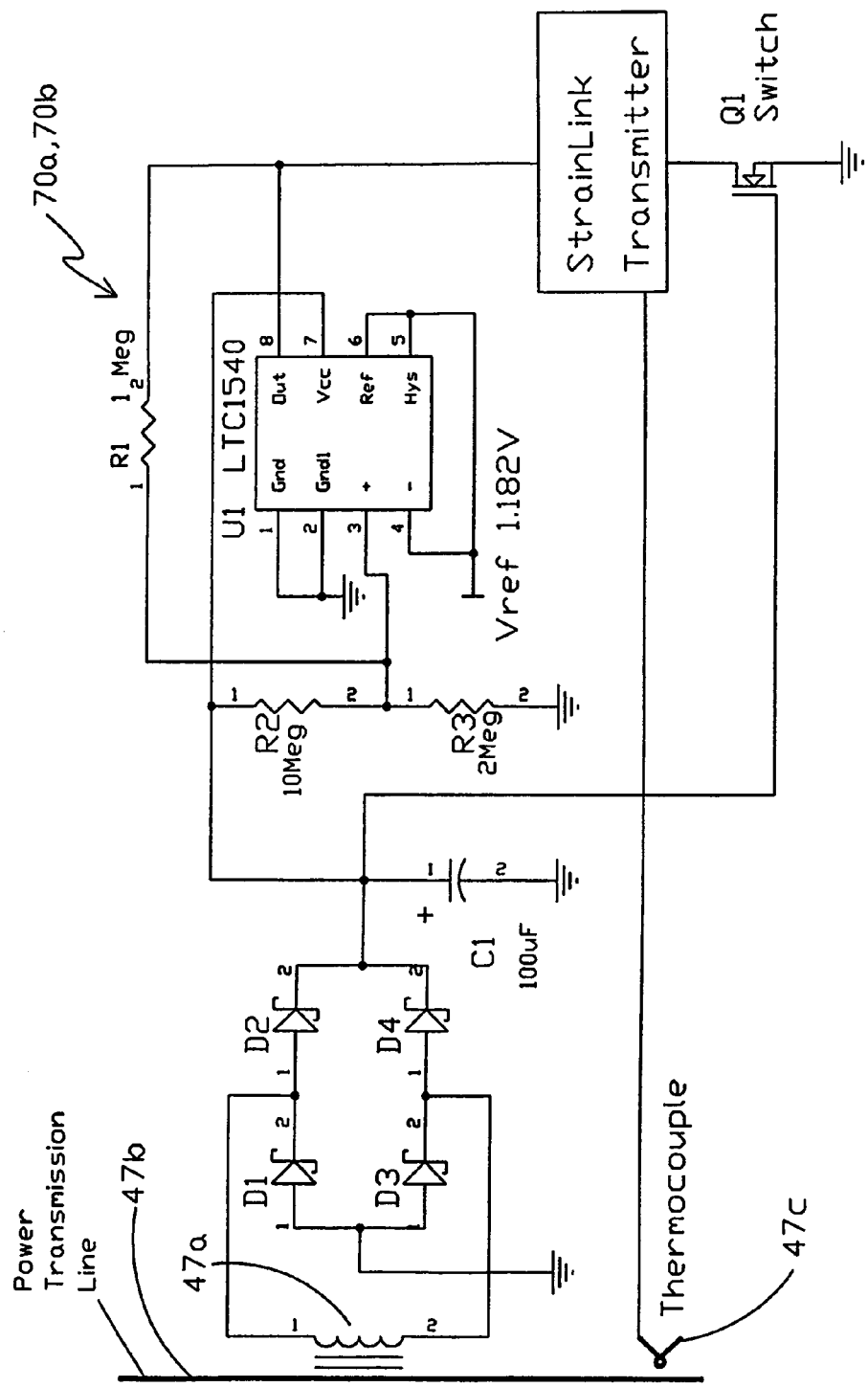
FIG. 4 is a block diagram of an alternate embodiment of an energy harvesting addressable wireless sensing node of the present invention in which energy is harvested from a power transmission line.

In an alternative embodiment PZT 20 device could be replaced with coil winding 47a that is closely coupled to power transmission line 47b that would allow energy in the magnetic field around the transmission line to be harvested, as shown in FIG. 4. Such a configuration could be used with thermocouples 47c to measure the temperature of transmission line 47b and detect an overheated condition in transmission line 47b. As with the PZT embodiment, the frequency of transmissions is proportional to current in the transmission line 47b.

Figure 5:
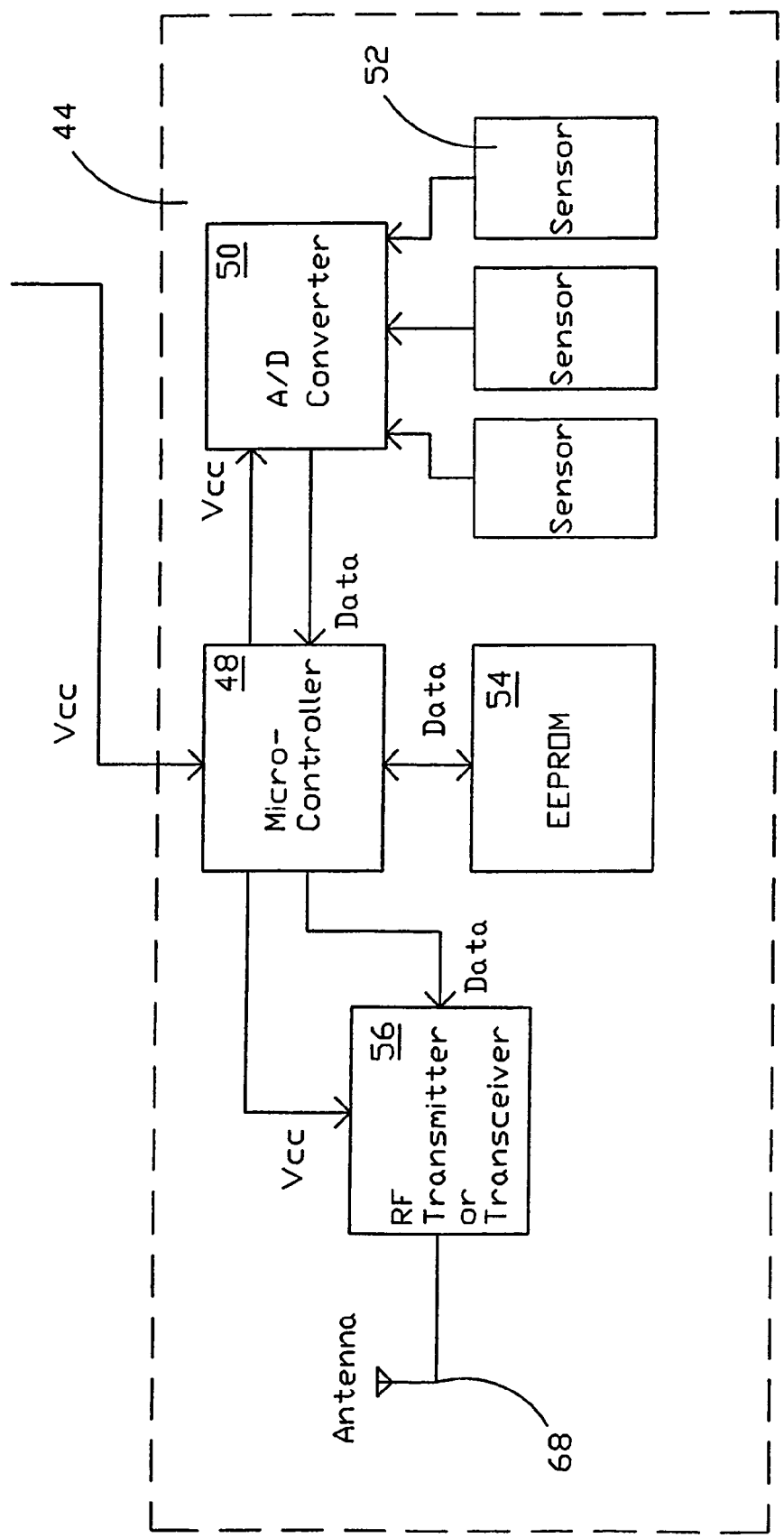
FIG. 5 is a block diagram of the wireless sensing module shown in FIGS. 3a, 3b.

Wireless sensing module 44 includes microcontroller or microprocessor 48, which controls provision of power to A/D convener 50, sensors 52, non-volatile memory 54, and RF transmitter 56, as shown in FIG. 5. Sensors can include such sensors as a temperature sensor, a strain gauge, a pressure sensor, a magnetic field sensor, an accelerometer, or a DVRT. By selectively providing power to or withholding power from these devices microcontroller 48 can achieve substantial energy savings. Microcontroller 48 also controls flow of data from A/D converter 50, from sensors 52, to and from nonvolatile memory 54 and to RF transmitter 56. A transceiver can be provided instead of RF transmitter 56 to enable two way communication, all powered by ambient vibrational energy. Non-volatile memory 54 is connected to record sensor data taken by sensors 52, as shown in FIG. 5.

The strain or vibrational energy 57 from the ambient environment is provided to PZT transducer 20 mounted on a machine, structure, or live subject, as shown in block diagram form in FIG. 3a and in schematic form in FIG. 3b. As indicated above, electrical output of PZT 20 is rectified in rectifier 40. DC output of rectifier 40 charges storage capacitor 42. Controller 46 monitors charge stored on storage capacitor 42, and when sufficient, provides Vcc power to wireless sensing module 44 for transmitting sensor data through antenna 68 to receiver 69a on base station 69b (FIG. 1d). Receiver 69a can be a transceiver. Controller 46 includes monitoring device 70, and switch Q1, which is formed of MOSFET transistor 72. When voltage across capacitor 42 is sufficient, monitoring device 70 turns on to provide Vcc to wireless sensing module 44. To reduce leakage and ensure that wireless sensing module 44 remains fully off and does not load storage capacitor 42 when voltage across storage capacitor 42 is below a threshold, transistor 72 is provided. When transistor 72 turns on, ground connection from wireless sensing module 44 is established.

Transistor 72 is needed because when voltage provided by storage capacitor 42 is too low, monitoring device 46 cannot provide its output in a known state. Monitoring device 46 may turn on falsely and load down storage device 42, preventing it from ever charging up. Monitoring device 46 is not itself a reliable switch unless supply voltage is above a threshold. To provide for operation in the regime when supply voltage is below that threshold, switch 72 is provided to ensure that wireless sensing module 44 remains fully off. Switch 72 connected between wireless sensing module 44 and ground and to has a single threshold.

In operation in one embodiment, monitoring device 70 becomes valid at 1.8 volts. Switch Q1 transistor 72 turns on at 2.0 V, enabling wireless sensing module 44 when storage capacitor 42 has sufficient charge to operate monitoring device 70 properly and can hold it off. Finally, when voltage at storage capacitor 42 reaches 6.3 V monitoring device 70 turns on and transfers charge from storage capacitor 42 to power wireless sensing module 44 for a brief period, until voltage discharges back to 2.9 volts, at which point monitoring device 70 turns off further transfer, and monitoring device 70 therefore continues to be in a valid state for subsequent operation, well above the 1.8 volts level needed for proper operation in a determinate state.

Thus, when sufficient charge is provided to storage capacitor 42 to provide a voltage equal to a higher threshold, monitoring device 70 turns on and connects wireless sensing module 44 to storage device 42. This discharges storage device 42 down to a lower threshold voltage at which point monitoring device 70 turns off, disconnecting wireless sensing module 44 from storage device 62. Storage device 42 can then recharge from energy supplied from PZT 20. However, if storage device 42 fully discharges, or if potential across storage device 42 falls below the lower threshold then monitoring device 70 may not be sufficiently powered to operate correctly. It may not fully disconnect wireless sensing module 44 from storage device 42, and thus, wireless sensing module 44 may continue to load storage device 42, preventing it from ever recharging. To prevent this possibility, switch 72 is provided which disconnects wireless sensing module 44 from ground when potential across storage capacitor 42 falls somewhat below the lower threshold.

The present inventors found that impedance mismatch between PZT 20 and storage capacitor 42 limits the amount of power that can be transferred from PZT 20 to storage capacitor 42. They recognized that energy transfer was limited by the fact that AC power generated by PZT 20 is presented by the PZT at a very high impedance and at low frequency. They observed that PZT 20 behaves as a constant current source, and that when piezoelectric elements are used to charge capacitors, such as storage capacitor 42, charging is determined by the short circuit current capability of PZT 20. When storage capacitor 42 is charged from a constant current source, such as PZT 20, storage capacitor 42 will charge at a rate proportional to the current provided by the constant current source. They further recognized that since the current available from PZT 20 is low, a long time is needed to charge a large capacitance, such as storage capacitor 42, needed for powering devices such as wireless sensing module 44 or other transmitters. They recognized the further difficulty that the larger leakage current presented by larger capacitors may exceed the charge rate of the constant current provided by PZT 20.

The present inventors developed a circuit that efficiently converts power from a high impedance current source, such as PZT 20, to a low impedance voltage source capable of charging a capacitor or battery storage device. The inventors also developed an efficient way to determine when enough power has been accumulated and applying that accumulated power to a useful purpose.

In addition, the present inventors recognized that if the available power in the piezoelectric element were to be efficiently converted from its low current and high impedance current source to a voltage source, the capacitor could be charged much faster than if the same capacitor were charged directly from the short circuit current of the piezoelectric element without this conversion. For example, if a voltage converter can present a 500K load to the piezoelectric element, approximately matching its impedance, the element will deliver 17.5 volts at 35 uA or 610 microwatts. If this power was then converted down to 100 ohms source impedance, even at 80% efficiency, the charge current would be more than 2.2 mA. By comparison, the output at the same level of excitation of the piezoelectric element when loaded to 100 ohms without a converter, is 6 millivolts at 60 uA or 0.36 microwatts, about 1,700 times less power.

Figure 9:
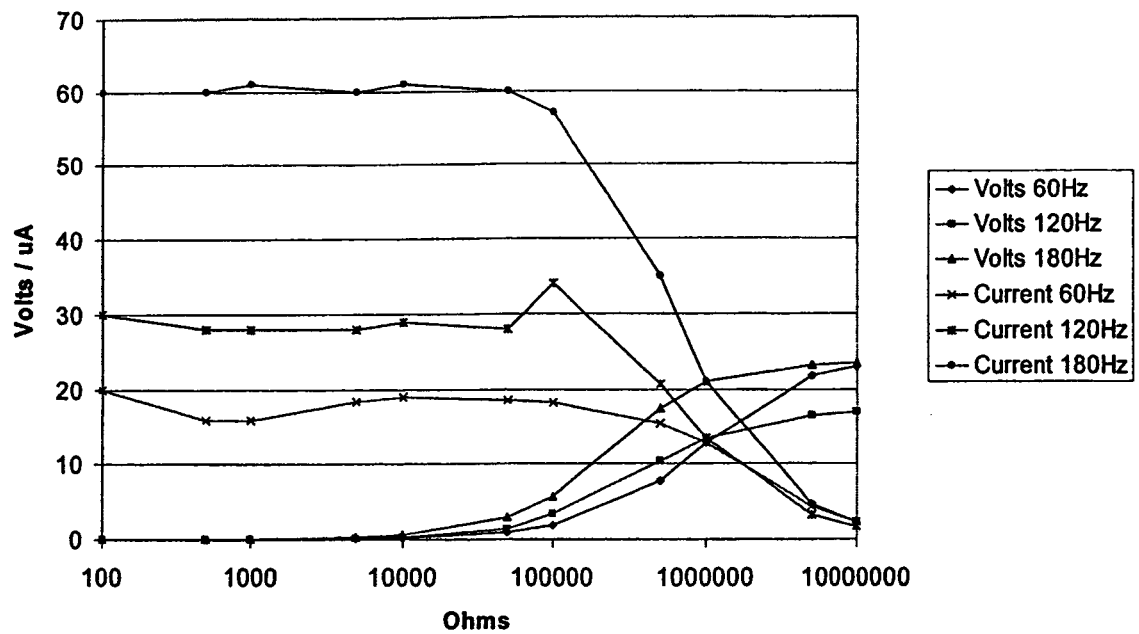
FIG. 9 is a diagram showing data from an experimental test showing that the PZT provided the same low current output as load resistance was varied from 100 ohms to 50 Kohms.
Figure 10:
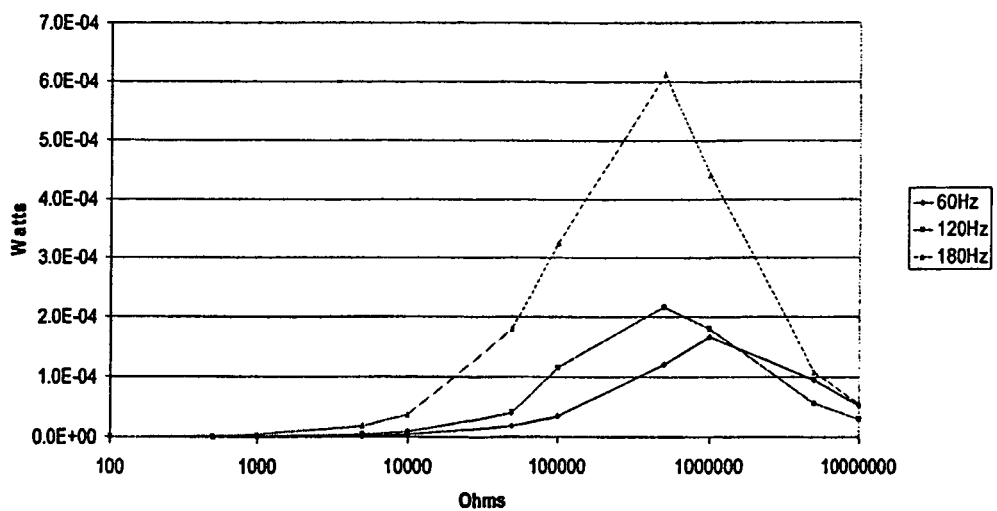
FIG. 10 is a diagram showing data from the experimental test showing that the optimum load impedance, that delivers maximum power, was found to be about 500 Kohms.

The inventors of the present invention conducted empirical tests on a sample of piezoelectric material in order to determine a viable topology of conversion circuit. A test was performed on a sample of highly flexible piezoelectric fiber. The sample was mounted in a 3 point bending jig with a strain gauge attached to the material, and excited to the same strain levels at three different frequencies. A decade resistance substitution box was used to load the output in order to determine the optimum load impedance for maximum power out of the material under these conditions. The same low current was measured as the load resistance was varied from 100 ohms to 50 Kohms as shown in FIG. 9. The optimum load impedance, that delivers maximum power, was found to be about 500 Kohms, as shown in FIG. 10.

The present inventors found that further substantial improvement in energy harvesting is available by adding an impedance converter circuit to the circuit of FIG. 3*a* that provide better impedance matching to the high impedance of PZT 20, while still finally providing the large capacitance needed to power wireless sensing module 44. The improvement to energy harvesting addressable wireless sensing node 18″, illustrated in block diagram form in FIG. 11*a* and in a schematic diagram in FIG. 11*b*, provides an additional stage of charge storage, monitoring, switching, and impedance conversion between rectifier 40 and controller 46 of FIG. 3*a*. In addition to providing more efficient transfer of energy from PZT to long term storage device 42′, the improvement allows a much larger capacitor or a battery to be used for that long term storage 42′, and this enables more information transfer by wireless sensing module 44.

Figure 6:
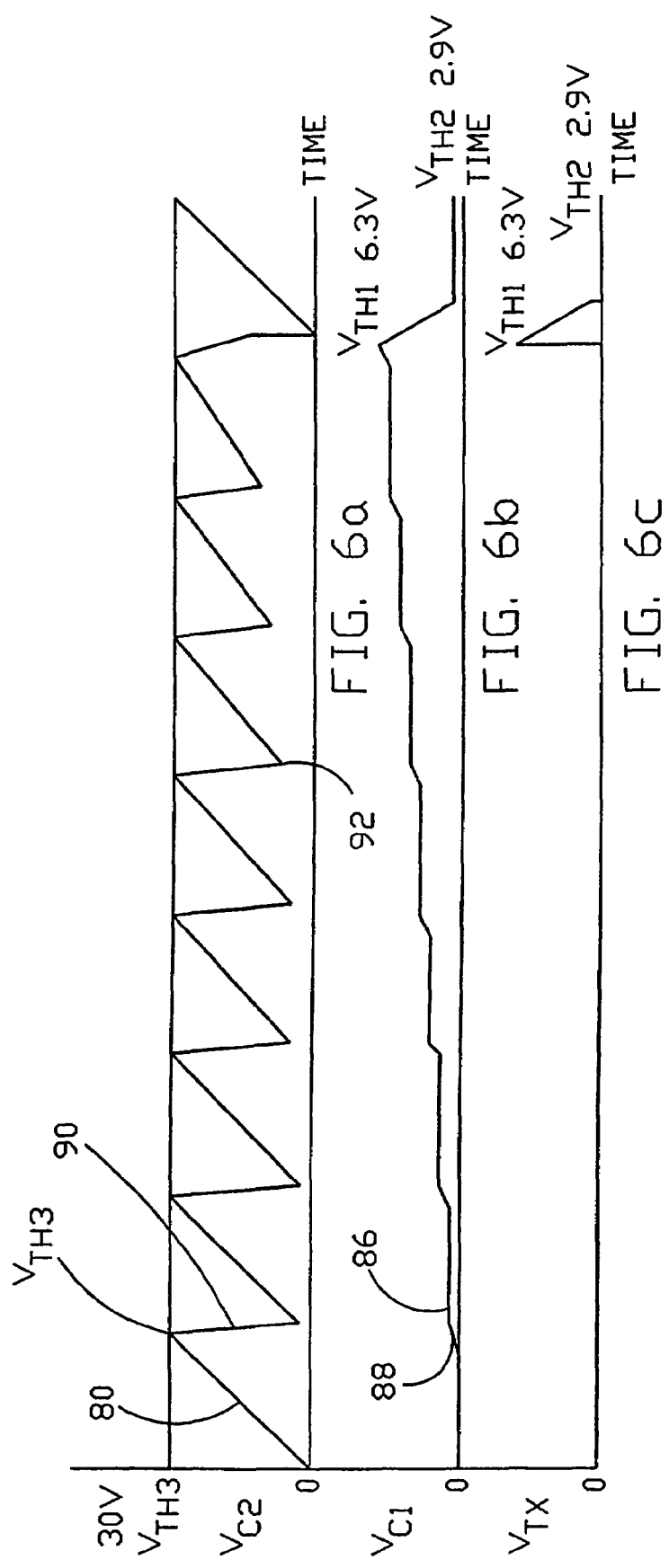
FIG. 6a is a timing diagram of voltage across capacitor C2 of FIG. 11.
FIG. 6b is a timing diagram of voltage across capacitor C1 of FIG. 11.
FIG. 6c is a timing diagram of voltage across the transmitter of FIG. 11 showing how charge gradually stored in long term storage capacitor C1 is used to briefly power the transmitter or transceiver.

PZT 20 connected to a source of mechanical energy, such as vibration or strain 57, produces a high impedance AC voltage in accordance with the strain or vibration 57 applied to PZT element 20. D1 and D2 (FIG. 11*b*) form Schottky barrier rectifier bridge rectifier 40 that converts the AC voltage from PZT 20 to DC. PZT 20 charges reactance element 78, such as small capacitor C2 along curve 80 until a voltage equal to Vth3 is reached, as shown in FIG. 11*a* and FIG. 6*a*.

Voltage Vth3 is sufficient to turn on switch 2, transistor 82 which connects DC-DC converter 84 to ground, enabling DC-DC converter 84 to turn on and operate. When DC-DC converter 84 turns on, it converts the high voltage stored on small capacitor C2 to a low voltage at a low impedance for providing a small boost 86 to the charge on long term storage capacitor 42′, capacitor C1, as shown along charging curve 88 in FIG. 6B. While long term storage capacitor C1 is charging, small capacitor C2 is discharging. The discharge of small capacitor C2, is shown along curve 90 in FIG. 6*a*, providing the charge to boost the voltage of long term storage capacitor C1 by the small step 86 shown in FIG. 6*b*. Voltage scales are the same on FIGS. 6*a*, 6*b*, 6*c*. Small capacitor C2 continues to discharge through DC-DC converter 84 until voltage on small capacitor C2 equals voltage on long term storage capacitor C1. Thus, as long term storage capacitor C1 charges up, small capacitor C2 discharges less and less fully, as shown by the continuous increase in the discharge voltage level 92 in FIG. 6A with each charging and discharging cycle of small capacitor C2, while the charge level of long term storage capacitor C1 continuously increases.

Although voltage on small capacitor C2 discharges, second switch 82 remains on because of delay introduced by capacitor C3 in parallel with resistor R2 in voltage divider 94. Thus, DC-DC converter 84 remains on while voltage across capacitor C2 drops below Vth3 as shown in FIG. 6A. R4, R5 and second switch 82 form a switch that disables any conversion until enough voltage is present on C2 to convert. This switch threshold is set to approximately 22 volts. DC-DC converter 84 is a high frequency stepdown DC to DC converter that has a typical quiescent current of 12 uA and is capable of 80% efficiency even with small load current. In this embodiment, DC-DC converter 84, U2 is an LT1934-1 (Linear Technology, Milpitas, Calif.). This converter was chosen due to its very low quiescent current.

Figure 11A:
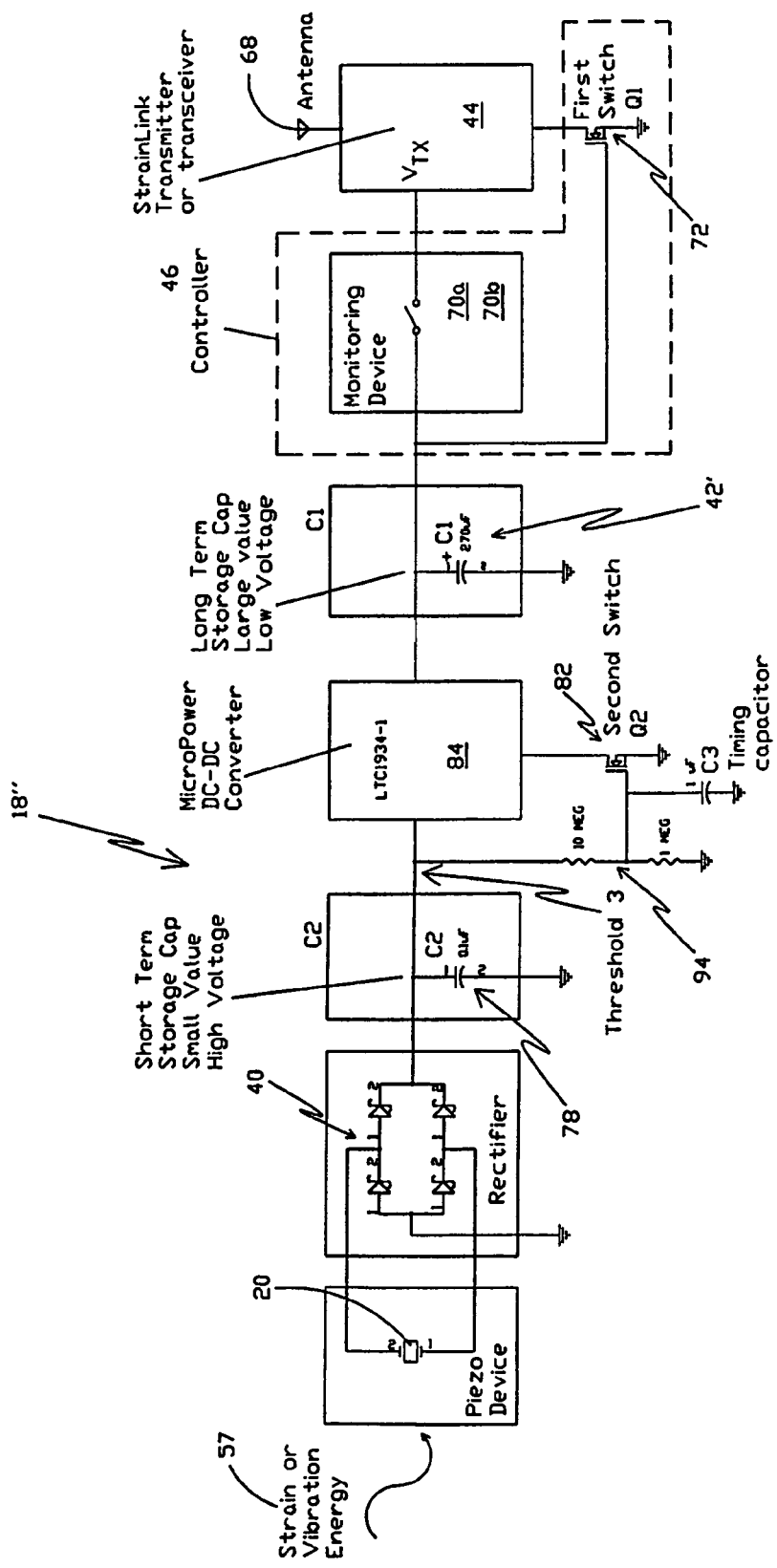
Figure 11B:
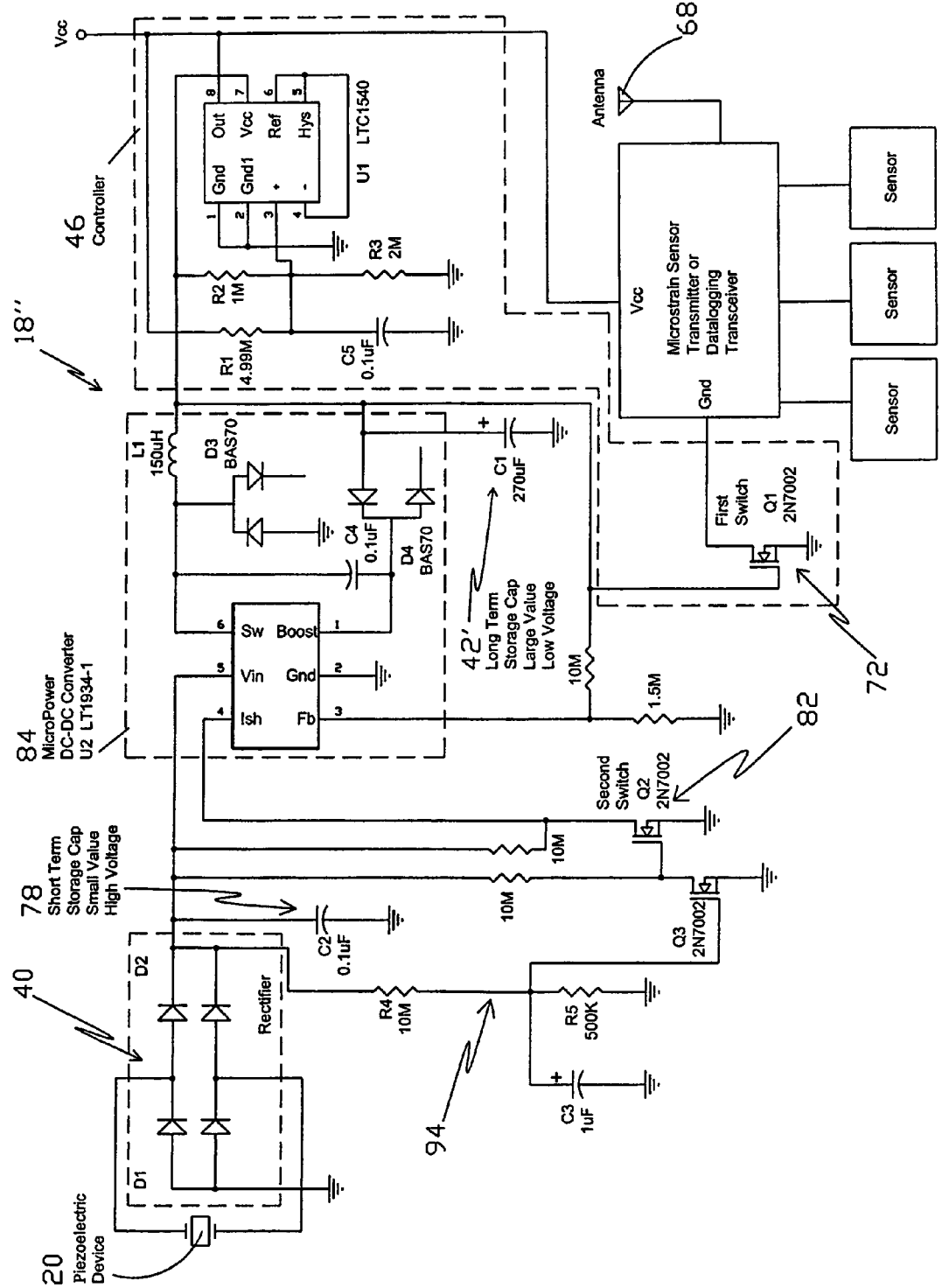

As also described for the circuit of FIGS. 3*a* and 3*b* and the circuit of FIGS. 11*a* and 11*b*, resistors R1, R2, R3, and comparator U1 form monitoring device 70*a* and also form voltage sensitive switch 70*b* that turns off connection to load 44 until enough charge has been accumulated on storage capacitor 42, 42′ to run load 44. Load 44 can be multiple wireless sensing module 44, or an array of such modules, as shown in FIG. 11*b*.

Monitoring device 70*a*/voltage sensitive switch 70*b* is in an undefined state, however, until at least 1.8 volts is available on its Vcc pin 7, which is connected to storage device 42, 42′. To avoid problems from this undefined state, MOSFET switch Q1 is provided to disconnect load 44 until voltage on storage device 42, 42′ has reached 2.0 volts. R2 & R3 set the turn-on threshold $V_{th2}$ of voltage sensitive switch 70*b* to 6.3 volts. R1 provides hysteresis to comparator U1 giving it two thresholds. Voltage sensitive switch 70*b* now turns on when voltage on storage device 42, 42′ reaches the higher threshold $V_{th1}$ of 6.3 volts and stays on until the voltage on storage device 42 discharges down to $V_{th2}$ the lower threshold of 2.9 volts. When storage device 42, 42′ reaches its higher threshold of 6.3 volts there is enough charge available on storage device 42, 42′ to power load 44 to operate for a brief period, for example, to transmit a burst of data. Load 44 may be a StrainLink transmitter or a data logging transceiver.

None of the charge provided to long term storage device 42′, is supplied to wireless sensing module 44 until the voltage on long term storage device 42′ reaches the higher threshold, $V_{th1}$, as shown in FIG. 6B. When voltage on long term storage device 42′, C1 reaches $V_{th1}$, monitoring device 70 now turns on, as described herein above. Switch Q1 (transistor 72) has already turned on before $V_{th2}$ was reached, and charge is now transferred from long term storage device 42', C1 to operate wireless sensing module 44, as shown in FIGS. 6B and 6C. Voltage on long term storage device 42', C1 discharges to $V_{th2}$, about 2.9 volts at which point monitoring device 70 turns off.

If voltage to switch Q1 declines too far, switch Q1 will turn off, and this shuts off transmitter 44 until enough energy is accumulated in storage device 42' to send another burst of data.

Multiple wireless sensing modules 44 or other devices can be provided on a network, each powered as described herein with energy harvested from its environment. The multiple wireless sensing module 44 can transmit on different frequencies or a randomization timer can be provided to add a random amount of time after wake up to reduce probability of collisions during transmission. However, since the time for charging is likely to differ from one wireless sensing module 44 to another, a randomization timer may not be needed. Each wireless sensing module 44 will transmit an address as well as data. Transceivers can be provided to each wireless sensing module 44 to provide two way communication. Preferably, if a battery is used that is recharged from the environment, sufficient energy will be available so it can wake up periodically to determine if something is being transmitted to it. If not it can go back to sleep mode. If so, it can receive the transmission. All the members can be managed by a broadcast signal or each wireless sensing module 44 can be addressed and programmed individually.

Figure 7:
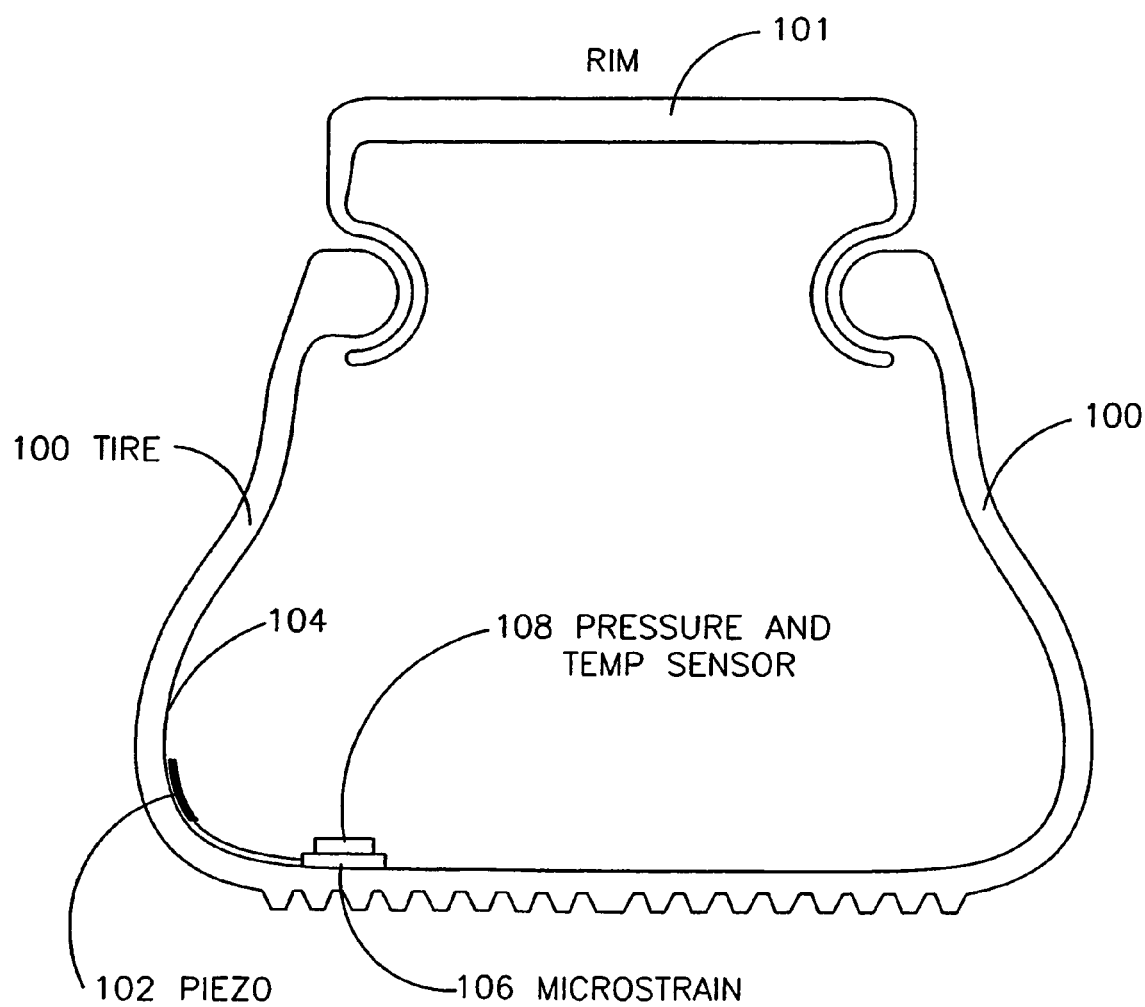
FIG. 7 is a cross sectional view of a tire having an energy harvesting device of the present invention to power transmitting pressure and temperature sense data.
Figure 8:
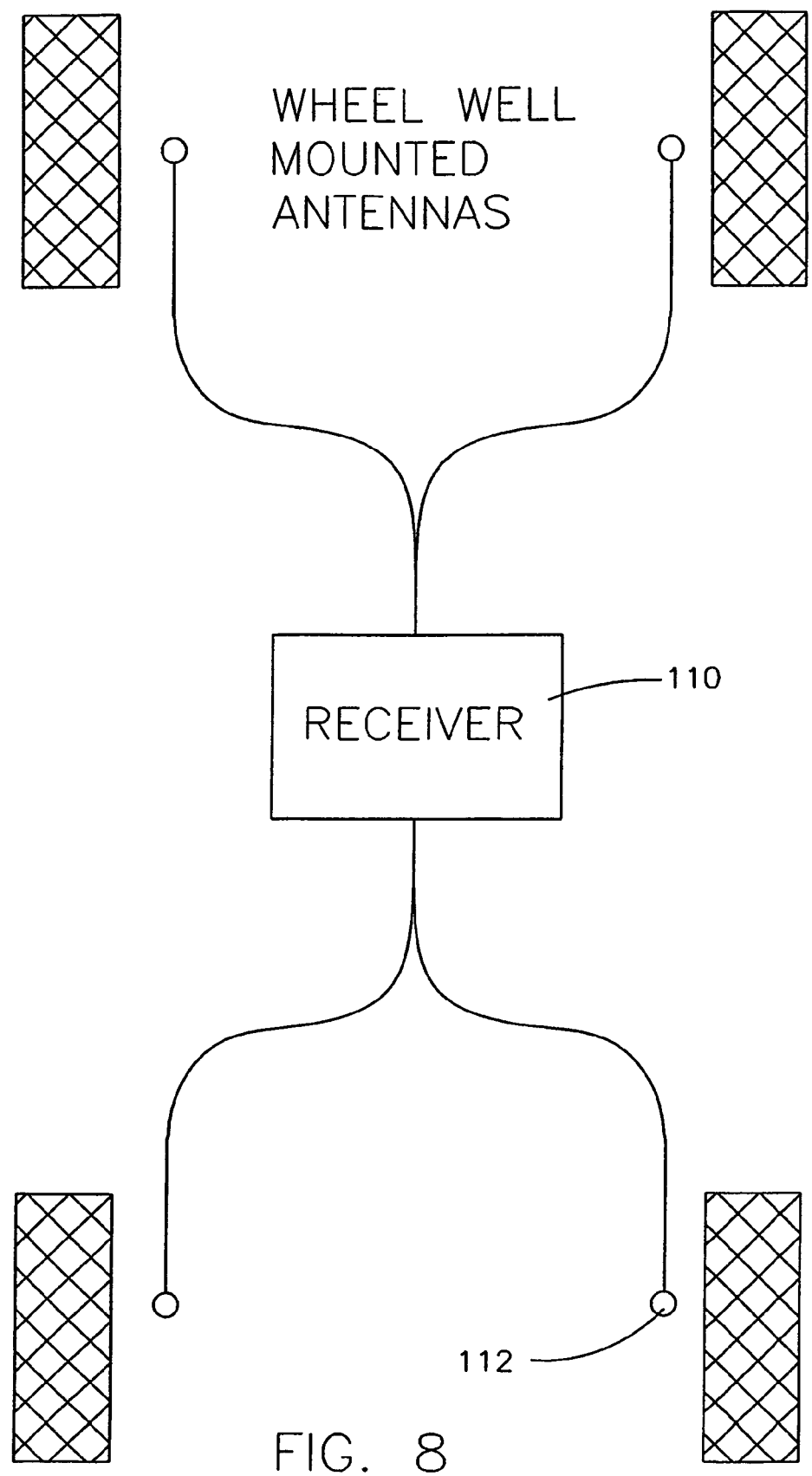
FIG. 8 is a schematic diagram showing a receiver mounted in a vehicle that receives signals indicating tire sensor data transmitted by each of the tires on the vehicle.

The present inventors have applied the energy harvesting system to design a device for embedding in a tire by a tire manufacturer for harvesting energy and for monitoring parameters, such as tire temperature and pressure on a vehicle and for transmitting the data, as shown in FIG. 7. The cross section of tire 100 shows the placement of PZT 102, or several such PZT elements, on or within interior sidewall 104 of tire 100 for gathering strain energy from flexing of tire 100 on rim 101 as the tire rotates. PZT 102 is connected to provide power to energy harvesting addressable wireless sensing node 106 for transmitting data from temperature and pressure sensors 108, such as Sensor Nor from Horten, Norway, to report this tire data. Energy harvesting addressable wireless sensing node 106 can be programmed to provide it with a 128 bit address. With such a large address there are enough combinations possible to allow every tire in the world to have a unique address. Thus, receiver 110 mounted in the vehicle can receive a signal indicating tire sensor data for each of the tires on the vehicle, as shown in FIG. 8. A display can provide the information to the operator. Alternatively, an alarm can signal when tire pressure or temperature is outside specified limits. Interference from other vehicles can be avoided by displaying only data from tires having known addresses.

Local antennas 112 can be provided in each wheel well (not shown) and the power output of energy harvesting addressable wireless sensing node 106 can be adjusted to provide reliable communications within the wheel well of the vehicle while avoiding interference with transmitters on adjacent vehicles.

Receiver 110, having antennas 112 positioned in each wheel well of the vehicle, can rapidly scan antennas 112 to determine the address and position of each tire on the vehicle. Because of the scanning of the antennas, even if tires are rotated, the display can indicate the location of a tire having a problem. Most modern receivers have the capability of accurately measuring received signal strength with fairly high resolution. In the case of inner and outer wheels in a single wheel well, these received signals can be qualified by received signal strength indication to distinguish the tires in the wheel well, even if they are rotated. Thus, the tire further from the antenna will have the weaker signal strength. In addition, the serial numbers of each tire would also be logged in the receiver flash memory to distinguish tires on the vehicle for feedback to a tire manufacturer.

One alternative to the tire position problem that does not require scanning or multiple antennas, is to have a technician sequentially scan a bar code on the tires at the time of tire installation on the vehicle, and communicate the tire position information to the automotive communications (CAN) bus or other communications bus within the vehicle, or even directly to the receiver. The position information is provided using a different protocol than the information tires are sending so this information can remain stored in the receiver while other data about the tire changes with each reading. In this way one receive antenna could receive data and an identification code from all tires on the vehicle, and the stored table linking identification and tire position can be used to communicate the position, temperature, and pressure of each tire. Interference from transmitters on adjacent vehicles is avoided since they would not have known identification codes.

The present inventors have also found ways to reduce power consumption as well as to provide power from energy harvesting. They recognized that power consumed by all of the system's components (sensor, conditioner, processor, data storage, and data transmission) must be compatible with the amount of energy harvested. Minimizing the power required to collect and transmit data correspondingly reduces the demand on the power source. Therefore, the present inventors recognized, minimizing power consumption is as important a goal as maximizing power generation.

The present inventors have developed and marketed sensors that require very little power. For example, they have previously reported on micro-miniature differential variable reluctance transducers (DVRT's) capable of completely passive (i.e., no power) peak strain detection. These sensors can be embedded in a material and will continuously monitor for the existence of a damaging strain state. By providing a hermetic seal the sensors can withstand harsh environmental conditions (moisture, salt, and vibration). The sensors can be reset remotely using shape memory alloys and (remotely applied) magnetic field energy, as described in a copending patent application Ser. No. 09/757,909, incorporated herein by reference. The present inventors have also recently developed totally passive strain accumulation sensors, which can be used to monitor fatigue. Furthermore, they have demonstrated novel radio frequency identification (RFID) circuits with the capability of interrogating these sensors in under 50 microseconds using less than 5 microamperes of current. Thus, although small amounts of energy may be available from energy harvesting, the energy so collected is enough to power sensors, electronics, and transmitters.

The present inventors have also developed wireless web enabled sensor network (WWSN) systems that require very little power. One strategy for minimizing power is demonstrated by the WWSN network architecture illustrated in FIG. 12. This is an ad hoc network that allows thousands of multichannel, microprocessor controlled, uniquely addressed sensing nodes TX to communicate to a central, Ethernet enabled receiver RX with extensible markup language (XML) data output format (http://www.microstrain.com/WWSN.html). A time division multiple access (TDMA) technique is used to control communications. TDMA allows saving power because the nodes can be in sleep mode most of the time. Individual nodes wake up at intervals determined by a randomization timer, and transmit bursts of data. By conserving power in this manner, a single lithium ion AA battery can be employed to report temperature from five thermocouples every 30 minutes for a period of five years. The XML data format has the advantage of allowing any user on the local area network (LAN) to view data using a standard Internet browser, such as Netscape or Internet Explorer. Furthermore, a standard 802.11b wireless local area network (WLAN) may be employed at the receiver(s) end in order to boost range and to provide bi-directional communications and digital data bridging from multiple local sensing networks that may be distributed over a relatively large area (miles). Further information about a wireless sensor network system developed by the present inventors is in patent application, incorporated herein by reference.

Another strategy for creating low power wireless sensor networks is demonstrated by MicroStrain's Data Logging Transceiver network (http://www.microstrain.com/DataLoggingTransceiver.html) as described in copending U.S. patent application Ser. No. 09/731,066, incorporated herein by reference. This system employs addressable sensing nodes which incorporate data logging capabilities, and a bi-directional RF transceiver communications links. A central host orchestrates sample triggering and high speed logging to each node or to all nodes. Data may be processed locally (such as frequency analysis) then uploaded when polled from the central host. By providing each sensor node with a 16 bit address, as many as 65,000 multichannel nodes may be hosted by a single computer. Since each node only transmits data when specifically requested, the power usage can be carefully managed by the central host.

For further energy savings, only limited data collected by sensors may be transmitted. For example, minimum, maximum and average data can be transmitted to reduce the amount of data transmitted and to thereby save energy. Standard deviation can also be locally calculated and transmitted, saving transmission time and energy.

For sensors detecting information where a band of frequencies is measured, such as measurements of a vibrating source with an accelerometer, a fast Fourier transform can be locally calculated and only the frequencies of vibration and the magnitude of vibration need be transmitted, rather than the entire waveform, to reduce the amount of information transmitted and to save energy.

The present inventors provided improved designs of each element of the entire measurement system, including the: vibrating/straining structure, piezo harvesting circuit, sensing circuit, microprocessor, on board memory, sensors, and RF data transmitter/transceiver to provide a system that operated with low power. The present inventors then built a prototype that both improved on the performance of energy harvesting devices and that reduced the energy consumption of each element of the measurement system, including the vibrating/straining structure, piezo harvesting circuit, sensing circuit, microprocessor, on board memory, sensors, and RF data transmitter/transceiver, as shown in FIGS. 3a, 3b, 4 and 5.

A demonstration energy harvesting circuit was built using a PZT fiber as its input, as shown in FIGS. 3a, 3b. The PZT device generates a voltage that is rectified by low forward drop diodes. This rectified voltage is used to charge a storage capacitor. The transfer is purely a function of the short circuit current of the piezoelectric structure, minus the loss of the rectifier stage, the self discharge of the storage capacitor, and any leakage current in the switch in its 'off' state. The behavior of this configuration is similar to charging a capacitor from a constant current source. The time required to charge the capacitor is inversely proportional to the amplitude of the strain or vibration applied to the PZT element at a given frequency of strain, and also proportional to the frequency of strain at a given amplitude. Once the voltage sensing switch detects that enough charge is stored on the capacitor, the load is connected to the storage capacitor. The load in this demonstration circuit is a MicroStrain Strainlink RF sensor microtransmitter. (MicroStrain, Inc. Williston, Vt. http://www.microstrain.com/slink.html) StrainLink is a multichannel, digital wireless transmitter system which allows direct sensor inputs from five pseudo differential (single ended) or three true differential channels. StrainLink features on-board memory, with user programmable digital filter, gain, and sample rates and with built-in error checking of pulse code modulated (PCM) data. Once programmed, these settings reside in the transmitter's non-volatile memory, which will retain data even if power is removed. The StrainLink transmitter is compatible with numerous sensor types including thermocouples, strain gauges, pressure sensors, magnetic field sensors and many others. The transmitter can transmit frequency shift keyed (FSK) digital sensor data w/checksum bytes as far as ⅓ mile on just 13 mA of transmit power supply current. During testing, the transmitter operated for approximately 250 mS on the power stored in the charged capacitor. This was ample time for the StrainLink to acquire data from a sensor and transmit multiple redundant data packets containing the sensed data.

Voltage sensing switch 70b was implemented using a nano-power comparator with a large amount of hysteresis. Some design difficulties arise when using an electronic device to perform such switching tasks. Voltage sensitive switch 70b itself needs to be powered from the source it is monitoring. When the available voltage is near zero the state of switch 70b is indeterminate. This can present a problem when the circuit is initially attempting to charge the capacitor from a completely discharged state. In the demonstration circuit as built, the switch defaults to 'on' until the supply voltage to its Vcc exceeds 0.7V, then it will turn off until the intended turn-on voltage level is reached. The transmitter draws constant current, except when the supply voltage is below the transmitter's regulator threshold. In this condition the current increases slightly from the normal operating current of 11 mA to about 15 mA at less than 1 volt. Because of this, and the fact that the switch is 'on' below approximately 0.7 volts, a silicon diode with equal to or greater than 0.7 V forward drop was added from the output of the switch to the transmitter power pin. This allows the storage capacitor voltage to charge to the point where the switch is active before the transmitter starts drawing current. The settings for voltage trip points were adjusted to 6.3V 'on' and 2.9V 'off'.

In practice, the voltage sensing switch is still falsely 'on' at supply voltages of up to 1 volt, at which point the diode is already conducting power into the load. Drawing current from the storage capacitor at this low voltage slows the charging of the capacitor. This creates a problematic "turn-on" zone where the capacitor is being drained at the same time it is being charged. This makes it difficult for the system to initially charge itself enough to begin operating properly. If enough strain energy is applied to the PZT element during initial system startup, then this turn-on zone is exceeded, and the system works properly.

The present inventors recognized that switching the positive rail e.g. a "high-side switch," inherently requires some supply voltage to be present in order to properly turn the load "off." This is not the case with a "low-side switch," or one in which the minus lead is switched to DC ground. FIGS. 3a, 3b, 11a, 11b illustrate an improvement to the switch that will eliminate the turn-on zone problem. It employs both the existing high side switch implemented with nanopower comparator V1, LTC 150, and the addition of a low side switch in the DC return path of the power source. The low side switch is implemented with an N channel enhancement mode MOSFET, such as first switch Q1, 72 that has a gate turn-on threshold higher than the minimum operating voltage of the high side switch. This combination eliminates the disadvantages of the high side switch and the difficulties with implementing the appropriate switching function using only low side switch components.

High side voltage sensing switch V1 may falsely turn on when storage capacitor 42' is charged to between 0.7 and 1.0 volts. No current will flow, however, until the supply voltage exceeds the Vgs voltage of the gate of MOSFET Q1, 72. The Vgs voltage is typically greater than 1.5 volts even with so-called logic level MOSFETS that are optimized for full saturation at logic level (5 volt) gate to source voltage. Once the charge on capacitor 42' has exceeded Vgs, the MOSFET will allow current to pass, but by that point, the voltage sensing circuit will have sufficient supply power to function properly. These changes allow energy harvesting circuit 18', 18" to efficiently begin charging itself even when it starts from a completely discharged state.

Efficiency of the energy storage element is an important factor in implementing efficient designs because the energy may need to be stored for significant time periods before it is used. In the demonstration energy harvesting system, an aluminum electrolytic capacitor was utilized as the storage element. This is not an ideal choice since its leakage loss is relatively high. In fact, it can be as much as ten times higher than that of the voltage sensing switch used to monitor the capacitor voltage. To minimize this problem, alternative capacitor technologies, such as tantalum electrolytic and ceramic, can be used.

No matter what capacitor technology is used, charge leakage is likely to be a limiting factor in applications where long term storage of charge is necessary. Batteries, can be used for long term energy storage device 42, 42', and have advantage of essentially zero charge leakage (<1% energy loss per year). Thin film batteries, such as those provided by Infinite Power Solutions, Littleton, Colo. www.infinitepowersolutions.com, offer advantage of being able to be charged and discharged in excess of 100,000 times. In addition, battery chemistry allows for a battery cell to be continuously charged when power is available, as supplied by the PZT. The battery cells have high enough peak energy delivery capability (10 mA pulsed power) to allow for short bursts of RF communications.

Reduced power consumption is inherently beneficial to the performance of systems using harvested energy. A significant reduction in power consumption can be realized through the use of embedded software in microcontroller 48 that controls the power consumed by the sensors, signal conditioning, processing, and transmission components of the energy harvesting wireless sensing systems (FIG. 5). By adjusting the time these devices are on, for example, power consumed can be reduced. In addition embedded processor 48 can be programmed to process and store sensed information rather than immediately transmit, and thereby reduce the frequency of data transmission. Finally the power levels used for RF communications can be reduced by bringing a receiver closer to the sensor nodes. This can be accomplished by providing multiple receivers for a sensor network, by bring an operator with a receiver closer, or by providing a mobile robot that approaches sensors and reads their data, as more fully described in copending application , incorporated herein by reference.

The most direct strategy to reduce the power consumed by the sensors and signal conditioners is to use sensors that do not require power, such as thermocouples, piezoelectric strain gauges, and piezoelectric accelerometers. For thermocouples, cold junction compensation can be provided with a micropower solid state temperature sensor (National Semiconductor, Milpitas, Calif.) that typically consumes 20 microamps current at 3 volts DC, for a continuous power consumption of only 0.06 milliwatts.

A second strategy is to employ sensors that do not need to transmit data frequently, such as temperature and humidity sensors. There are several very low power humidity sensors, for example from Honeywell that can be employed along with thermocouples or solid state temperature sensors to provide periodic data updates. For these types of measurements, the reading changes slowly, so energy can be conserved by transmitting the data infrequently.

A third strategy to minimize the power consumed by sensors 52 is to pulse the power to sensors 52 and to time the reading of data from A/D converter 50 appropriately. With the sensor on only for a brief period of time to achieve a stable reading and to obtain that reading for storage or transmission, much energy can be saved. Microstrain has successfully used this technique for powering and gathering data from strain gauges used in medical implants. The current, and therefore the power, savings that can be realized are significant. For example, a 350 ohm strain gauge bridge excited with 3 volts DC will consume approximately 8.6 milliamps. If powered continually, this represents a power drain of 25 milliwatts. By only providing the excitation voltage at periodic intervals and performing digital data conversion under microprocessor control, we have been able to reduce the sensor excitation time to 200 microseconds. For applications where a strain gauge reading is required every 100 milliseconds (10 Hz), the effective power drain is reduced by a factor of 500, (from 25 to only 0.05 milliwatts).

Power reductions in the signal conditioning are also realized by using highly integrated circuits (IC), such as the AD7714 by Analog Devices (Norwood, Mass.), that use very low power and combine a programmable gain instrumentation amplifier (110 dB CMRR), multiplexer, and 22 bit sigma-delta analog to digital converter. The current consumed by the AD7714 is 200 microamps at 3 volts DC, or 0.6 milliwatts. The AD7714 can be programmed to accept 3 full differential or five single ended sensor inputs. We have successfully employed this IC for use with foil and piezoresistive strain gauges, thermocouples, temperature sensors, torque sensors, and load cells. With a rectifier, a differential amplifier and periodic excitation we have successfully used these ICs with inductive displacement sensors.

The power consumed by the embedded processor can be reduced by using low power embedded microcontrollers, such as the PIC 16 series from MicroChip Technologies (Chandler, Ariz.). Such embedded processors include integrated instrumentation amplifiers to facilitate sensor conditioning, and integrated radio frequency (RF) oscillators to facilitate wireless communications. By including more capability on the processor, component count and system complexity are reduced, and there is a reduction in power consumed. Further reductions in power consumption are realized by placing the processor in "sleep mode" while the energy harvesting circuit is storing energy in its capacitor bank or battery. The processor (and its integrated amplifier/RF stage) does not come out of sleep mode until the energy harvesting circuit detects that the stored charge is adequate for the programmed task, such as reading a sensor. This prevents the measurement system and processor from loading the energy harvesting circuit and allows storage of energy to proceed most efficiently.

Further reductions in power consumption may be realized by using lower clock rates for the embedded processor. For example our existing Strainlink digital wireless sensor transmitter product (http://www.microstrain.com/slink.html) is normally run at a clock rate of 4 MHz, and it consumes 600 microamps at 3 volts DC (1.8 milliwatts). For temperature measurement applications (or any other application requiring relatively infrequent data samples), we can reduce the processor's clock rate to 100 KHz, allowing a more than 20 fold power reduction to 28 microamps at 3 volts DC (0.084 milliwatts). For many health monitoring applications, we can improve performance by simply slowing down the system clock.

The energy required to power sensors, acquire data, and process/store these data is much lower than the energy required to wirelessly transmit these data. In the preceding discussion, we have shown that thermocouples (0 milliwatts) with cold junction compensation (0.06 milliwatts) could be combined with a smart microcontroller (0.084 milliwatts) and a very low power, highly integrated signal conditioner (0.6 milliwatts) to provide continuous thermocouple readings with a power drain of 0.744 milliwatts. This is in sharp contrast to the RF communications section of the electronics, which may require over 10 milliamps at 3 volts DC for a power drain of 30 milliwatts in order to provide adequate wireless range and good margin in electrically noisy environments.

By programming the processor to acquire and log sensed data and to compare these data to programmable threshold levels the frequency of RF transmission can be reduced to save power. If the sensed data exceeds or falls below the acceptable operating temperature ranges, then the processor transmits its data, along with its address byte. A randomization timer is be used to insure that if multiple transmitters are transmitting their data (or alarm status) simultaneously, the probability of RF collisions is statistically small, as described in http://www.microstrain.com/WWSN.html, a paper entitled SPIE Scalable Wireless Web Sensor Networks, SPIE Smart Structures and Materials, March, 2002, by Townsend et al. In the event that threshold levels are not crossed, stored summary data, such as mean, maximum, minimum, and standard deviation, are periodically transmitted over time intervals, such as hourly or daily. Transmission of processed data, such as these trends, and periodic transmission of this data saves more energy.

The processors may also be programmed to acquire bursts of data from a vibrating structure using an accelerometer. These data may be processed using average fast fourier transform (FFT) and power spectral density (PSD) analyses. The processed data would allow the RF link to transmit only the fundamental vibration frequencies, which would greatly reduce the amount of data that is transmitted and thereby greatly reduce the "on-time of the RF link.

To further reduce power consumed by the energy harvesting sensing nodes, we could reduce the RF communications power levels at the expense of range. For some applications, it may be possible for Navy maintenance personnel to approach an area where shipboard monitoring nodes have been placed. The energy harvesting monitoring nodes may also include RF transceivers, which would provide for bidirectional communications. Instead of only periodically transmitting sensed data, these nodes are programmed to periodically activate their integral receiver to detect the presence of maintenance personnel over the wireless link. A handheld transceiver carried by maintenance workers would query various nodes on the network and collect their data into the handheld device. This would greatly reduce the need for long range wireless data communications, and therefore would allow for reduced RF power levels at the remote energy harvesting sensor nodes. Microstrain has developed a high speed data logging transceiver product that could be adapted to this purpose (http://www.microstrain.com/DataLoggingTransceiver.html).

The vibrational energy harvesting unit is illustrated schematically in FIGS. 1a-1d. It consists of circuit board 25 that is rigidly fixed to some vibrating component, such as vibrating machine 19. Leaf spring 22 is mounted to this base in a cantilever configuration. Proof mass 24 is suspended at the free end of the leaf spring, and this can be adjusted to more nearly provide a resonance frequency close the vibration frequency. One or more PZT elements 20 are bonded to the surfaces of leaf-spring 22 such that when spring 22 deflects, PZT 20 will undergo tensile/compressive strains and therefore be stimulated to generate an electrical output suitable for input into energy harvesting circuit 18', 18". To maximize the output of PZT 20, leaf spring 22 is preferably constructed using a "constant strain" profile, as shown in FIG. 1c, such that the strains experienced by the PZT elements are uniform along their length. To provide a constant strain profile, leaf spring flexure element 22 can have a taper, as shown in FIG. 1c. Enclosure 26 surrounds the device to keep contaminants out, and to make the device convenient to handle and damage resistant.

Enclosure 26 measures approximately 50×50×150 mm and leaf spring flexure element 22 has adjustable proof mass 24 of between 100 and 500 grams. Tuning the unit will be accomplished by adjusting the size of proof mass 24, which can be washers, as shown in FIG. 1c. The energy harvester is capable of generating sufficient energy to intermittently power a transmitter and several low power sensors, as shown in FIGS. 3a, 3b, 11a, 11b.

While several embodiments of the invention, together with modifications thereof, have been described in detail herein and illustrated in the accompanying drawings, it will be evident that various further modifications are possible without departing from the scope of the invention. Nothing in the above specification is intended to limit the invention more narrowly than the appended claims. The examples given are intended only to be illustrative rather than exclusive.

What is claimed is:

1. A system for measuring a parameter of a moving part, comprising:
   a moving part;
   an energy harvesting device mounted on and moving with said moving part, wherein said energy harvesting device harvests mechanical energy from movement of said moving part and converts said mechanical energy into electrical energy;
   a sensor mounted on and moving with said moving part, wherein said sensor measures a parameter of said moving part;
   a non-volatile memory device mounted on and moving with said moving part, wherein said non-volatile memory device is connected for recording sensor data; and
   a transmitter mounted on and moving with said moving part, wherein said transmitter is connected for transmitting at least one from the group consisting of said data and information derived from said data, wherein said transmitter is powered by energy derived from said energy harvesting device.

2. A system as recited in claim 1, wherein said energy harvesting device is capable of harvesting energy from rotation of said moving part.

3. A system as recited in claim 2, wherein said energy harvesting device further comprises a rechargeable source of power configured to receive and store energy harvested by said energy harvesting device.

4. A system as recited in claim 3, wherein said rechargeable source of power comprises at least one from the group including a battery and a capacitor.

5. A system as recited in claim 1, wherein said sensor comprises at least one from the group including a temperature sensor, a strain sensor, and a sensor to measure rate of rotation.

6. A system as recited in claim 1, further comprising a receiver mounted on said moving part.

7. A system as recited in claim 6, wherein said transmitter and said receiver comprise a transceiver.

8. A system as recited in claim 1, further comprising a processor mounted on said moving part.

9. A system as recited in claim 8, further comprising an A/D converter for converting sensor data to digital data.

10. A system as recited in claim 9, wherein said nonvolatile memory is connected for storing said digital sensor data.

11. A system as recited in claim 10, wherein said nonvolatile memory is at least one from the group consisting of integral with and connected to said processor.

12. A system as recited in claim 10, wherein said nonvolatile memory contains a unique address to identify data transmitted by said transmitter.

13. A system as recited in claim 8, wherein said processor contains a program to process said data before transmitting.

14. A system as recited in claim 8, wherein said processor controls operation of said transmitter.

15. A system as recited in claim 1, wherein said moving part comprises at least one from the group including a tire, a machine, an engine, an engine mount, a shaft, a propeller drive shaft element, a turbine engine component, and a structural support element.

16. A system as recited in claim 1, wherein said energy harvesting device is capable of harvesting mechanical energy from vibration of said moving part.

17. A system as recited in claim 1, wherein said energy harvesting device is capable of harvesting strain energy from said moving part.

18. A system as recited in claim 17, wherein said energy harvesting device is capable of harvesting mechanical energy from bending of said moving part.

19. A system for measuring a parameter of a moving part, comprising:
a moving part;
an energy harvesting device mounted on said moving part, wherein said energy harvesting device harvests strain energy from said moving part and converts said strain energy into electrical energy;
a sensor mounted on said moving part, wherein said sensor measures a parameter of said moving part;
a non-volatile memory device mounted on said moving part, wherein said non-volatile memory device is connected for recording sensor data; and
a transmitter mounted on said moving part, wherein said transmitter is is connected for transmitting at least one from the group consisting of said data and information derived from said data, wherein said transmitter is powered by energy derived from said device for harvesting strain energy.

20. A system as recited in claim 19, wherein said energy harvesting device is capable of harvesting strain energy from rotation of said moving part.

21. A system as recited in claim 19, wherein said energy harvesting device further comprises a rechargeable source of power configured to receive and store energy harvested by said energy harvesting device.

22. A system as recited in claim 21, wherein said rechargeable source of power comprises at least one from the group including a battery and a capacitor.

23. A system as recited in claim 19, wherein said sensor comprises at least one from the group including a temperature sensor, a strain sensor, and a sensor to measure rate of rotation.

24. A system as recited in claim 19, further comprising a receiver mounted on said moving part.

25. A system as recited in claim 24, wherein said transmitter and said receiver comprise a transceiver.

26. A system as recited in claim 19, further comprising a processor mounted on said moving part.

27. A system as recited in claim 26, further comprising an A/D converter for converting sensor data to digital data.

28. A system as recited in claim 27, wherein said nonvolatile memory is connected for storing said digital sensor data.

29. A system as recited in claim 28, wherein said nonvolatile memory is at least one from the group consisting of integral with and connected to said processor.

30. A system as recited in claim 28, wherein said nonvolatile memory contains a unique address to identify data transmitted by said transmitter.

31. A system as recited in claim 26, wherein said processor contains a program to process said data before transmitting.

32. A system as recited in claim 26, wherein said processor controls operation of said transmitter.

33. A system as recited in claim 19, wherein said moving part comprises at least one from the group including a tire, a machine, an engine, an engine mount, a shaft, a propeller drive shaft element, a turbine engine component and a structural support element.

34. A system for measuring a parameter of a tire, comprising:
a tire;
a device for harvesting strain energy mounted on said tire, wherein said device is mounted to harvest strain energy from flexing of said tire and wherein said device converts said strain energy into electrical energy;
a sensor mounted on said tire, wherein said sensor measures a parameter of said tire;
a non-volatile memory device mounted on said tire, wherein said non-volatile memory device is connected for recording sensor data; and
a transmitter mounted on said tire connected, wherein said transmitter is connected for transmitting at least one from the group consisting of said data and information derived from said data, wherein said transmitter is powered by energy derived from said device for harvesting strain energy.

35. A system as recited in claim 34, wherein said a device for harvesting strain energy harvests energy from flexing of said tire as said tire rotates.

36. A system as recited in claim 34, wherein said device for harvesting strain energy further comprises a rechargeable source of power configured to receive and store energy harvested by said device for harvesting strain energy.

37. A system as recited in claim 36, wherein said rechargeable source of power comprises at least one from the group including a battery and a capacitor.

38. A system as recited in claim 34, wherein said sensor comprises at least one from the group including a temperature sensor and a pressure sensor.

39. A system as recited in claim 34, further comprising a receiver mounted on said tire.

40. A system as recited in claim 39, wherein said transmitter and said receiver comprise a transceiver.

41. A system as recited in claim 34, further comprising a processor mounted on said tire.

42. A system as recited in claim 41, further comprising an A/D converter for converting sensor data to digital data.

43. A system as recited in claim 42, wherein said non-volatile memory is connected for storing said digital sensor data.

44. A system as recited in claim 43, wherein said non-volatile memory is at least one from the group consisting of integral with and connected to said processor.

45. A system as recited in claim 43, wherein said non-volatile memory contains a unique address to identify data transmitted by said transmitter.

46. A system as recited in claim 41, wherein said processor contains a program to process said data before transmitting.

47. A system as recited in claim 41, wherein said processor controls operation of said transmitter.

48. A system as recited in claim 34, further comprising a feedback mechanism mounted on said tire for adjusting operation of said tire based on said data.

* * * * *